(12) United States Patent
Kondo et al.

(10) Patent No.: US 9,979,157 B2
(45) Date of Patent: May 22, 2018

(54) EXTERNAL-RESONATOR-TYPE LIGHT-EMITTING DEVICE

(71) Applicant: NGK INSULATORS, LTD., Nagoya (JP)

(72) Inventors: Jungo Kondo, Miyoshi (JP); Shoichiro Yamaguchi, Ichinomiya (JP); Tetsuya Ejiri, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days. days.

(21) Appl. No.: 15/375,587

(22) Filed: Dec. 12, 2016

(65) Prior Publication Data

US 2017/0093127 A1 Mar. 30, 2017

Related U.S. Application Data

(63) Continuation of application No. PCT/JP2015/066924, filed on Jun. 11, 2015.

(30) Foreign Application Priority Data

Jun. 13, 2014 (JP) ................................. 2014-122620

(51) Int. Cl.
*H01S 5/14* (2006.01)
(52) U.S. Cl.
CPC .............. *H01S 5/141* (2013.01); *H01S 5/146* (2013.01)
(58) Field of Classification Search
CPC ....................................................... H01S 5/141
See application file for complete search history.

(56) References Cited

U.S. PATENT DOCUMENTS 5,993,073 A * 11/1999 Hamakawa .......... G02B 6/4204
385/88
6,091,744 A 7/2000 Sorin et al.
(Continued)

FOREIGN PATENT DOCUMENTS

JP 49-128689 A1 12/1974
JP 56-148880 A1 11/1981
(Continued)

OTHER PUBLICATIONS

English translation of Written Opinion (Application No. PCT/JP2015/066924) of the International Search Authority dated Dec. 22, 2016.
(Continued)

*Primary Examiner* — Dung Nguyen
(74) *Attorney, Agent, or Firm* — Burr & Brown, PLLC

(57) ABSTRACT

An external resonator type light-emitting device includes a light source oscillating a semiconductor laser light and a grating element configuring an external resonator together with the light source. The light source includes an active layer oscillating said semiconductor laser light. The grating element includes an optical waveguide and a plurality of Bragg gratings formed in the optical waveguide. The optical waveguide includes an incident face to which the semiconductor laser light is incident and an emitting face from which an emitting light having a desired wavelength is emitted. A half value reflectance $R_{50}$ is larger than a reflectance $R_2$ at an emitting end of the light source. A half value reflectance $R_{50}$ is 3% or larger. A combined reflectance is not less than the half value reflectance $R_{50}$ in a wavelength region $\Delta\lambda_{50}$. The wavelength region $\Delta\lambda_{50}$ is continuous over 10 nm or more and 30 nm or less, provided that a half value reflectance is defined as 50 percent of a maximum value Rmax of the combined reflectance of the Bragg gratings.

8 Claims, 20 Drawing Sheets

(56) References Cited

U.S. PATENT DOCUMENTS

| | | |
|---|---|---|
| 6,295,306 B1 | 9/2001 | Asami |
| 6,391,214 B1 | 5/2002 | Kovacic |
| 6,693,946 B2 | 2/2004 | Wilson et al. |
| 7,424,044 B2 | 9/2008 | Zheng et al. |
| 7,653,317 B2 | 1/2010 | Ohki et al. |
| 2003/0108081 A1 | 6/2003 | Ryu et al. |
| 2009/0290613 A1 | 11/2009 | Zheng et al. |
| 2014/0362886 A1 | 12/2014 | Kondo et al. |
| 2016/0268773 A1* | 9/2016 | Kondo ............... H01S 5/0287 |

FOREIGN PATENT DOCUMENTS

| | | |
|---|---|---|
| JP | 07-035933 A1 | 2/1995 |
| JP | 10-084168 A1 | 3/1998 |
| JP | 10-293234 A1 | 11/1998 |
| JP | 11-040883 A1 | 2/1999 |
| JP | 11-251690 A1 | 9/1999 |
| JP | 2000-082864 A1 | 3/2000 |
| JP | 2002-006148 A1 | 1/2002 |
| JP | 2002-134833 A1 | 5/2002 |
| JP | 2003-069147 A1 | 3/2003 |
| JP | 3667209 B2 | 7/2005 |
| JP | 2006-222399 A1 | 8/2006 |
| JP | 2007-081215 A1 | 3/2007 |
| JP | 2010-171252 A1 | 8/2010 |
| JP | 5641631 B1 | 12/2014 |
| WO | 01/22544 A1 | 3/2001 |
| WO | 2005/031930 A1 | 4/2005 |
| WO | 2013/034813 A2 | 3/2013 |
| WO | 2014/196553 A1 | 12/2014 |

OTHER PUBLICATIONS

U.S. Appl. No. 15/375,550, filed Dec. 12, 2016, Kondo et al.

Kazunori Yamada, et al., "Highly Accurate Wavelength Control of External Cavity Laser Module with Fiber Grating," *Transactions on Fundamentals of Electronics, Communications and Computer Sciences*, C-II, 1998, vol. J81, No. 7, pp. 665-665.

Yujin Zheng, et al., "High-Brightness Narrow-Bandwidth High-Power Laser Diode Array Based on an External-Cavity Technique," *Technical Reports on Fundamentals of Electronics, Communications and Computer Sciences*, LQE, 2005, vol. 105, No. 7, pp. 17-20.

Akira Mugino, et al., "Output Power Optimization of 980 nm Pump Lasers Wavelength-Locked Using Fiber Bragg Grating," *Furukawa Review*, Jan. 2000, No. 105, pp. 24-29.

Handbook of Semiconductor Lasers and Photonic Integrated Circuit, edited by Y. Suematsu and A.R.Adams, 1994, pp. 363-374.

International Search Report and Written Opinion (Application No. PCT/JP2015/066924) dated Aug. 25, 2015.

* cited by examiner

Laser oscillation condition:

$$C_{out}^2 r_1 r_2 \exp\{(\xi_{th} g_{th} - \alpha_a)L_a\} \times \exp\{-j(2\beta_a L_a)\} = 1$$

Gain condition:
$$g_{th} = \frac{1}{\xi_{th}}\left\{\alpha_a + \frac{1}{L_a}\ln\left(\frac{1}{C_{out}^2 r_1 r_2}\right)\right\}$$

Phase condition:
$$2\beta_a L_a = 2\pi m$$

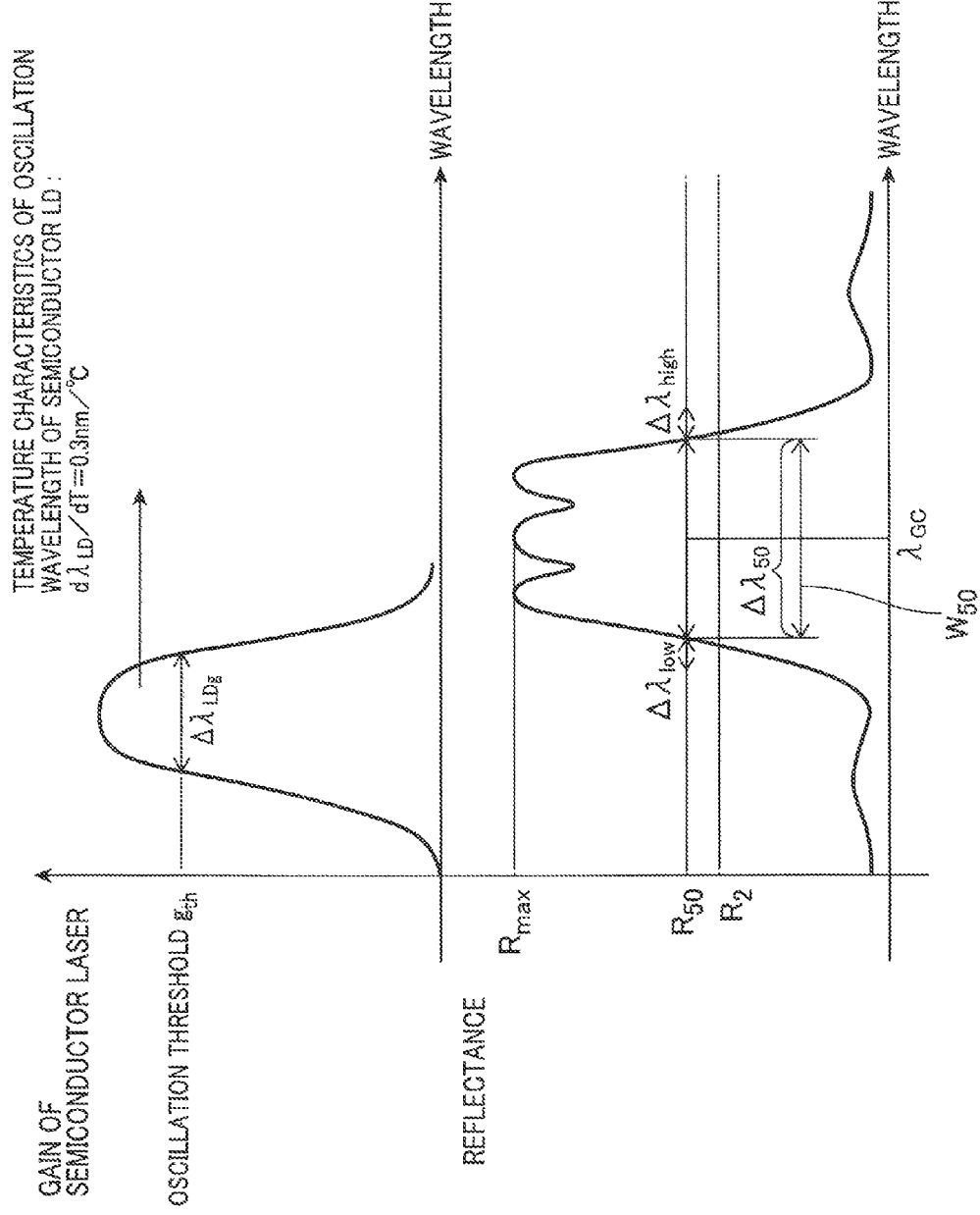

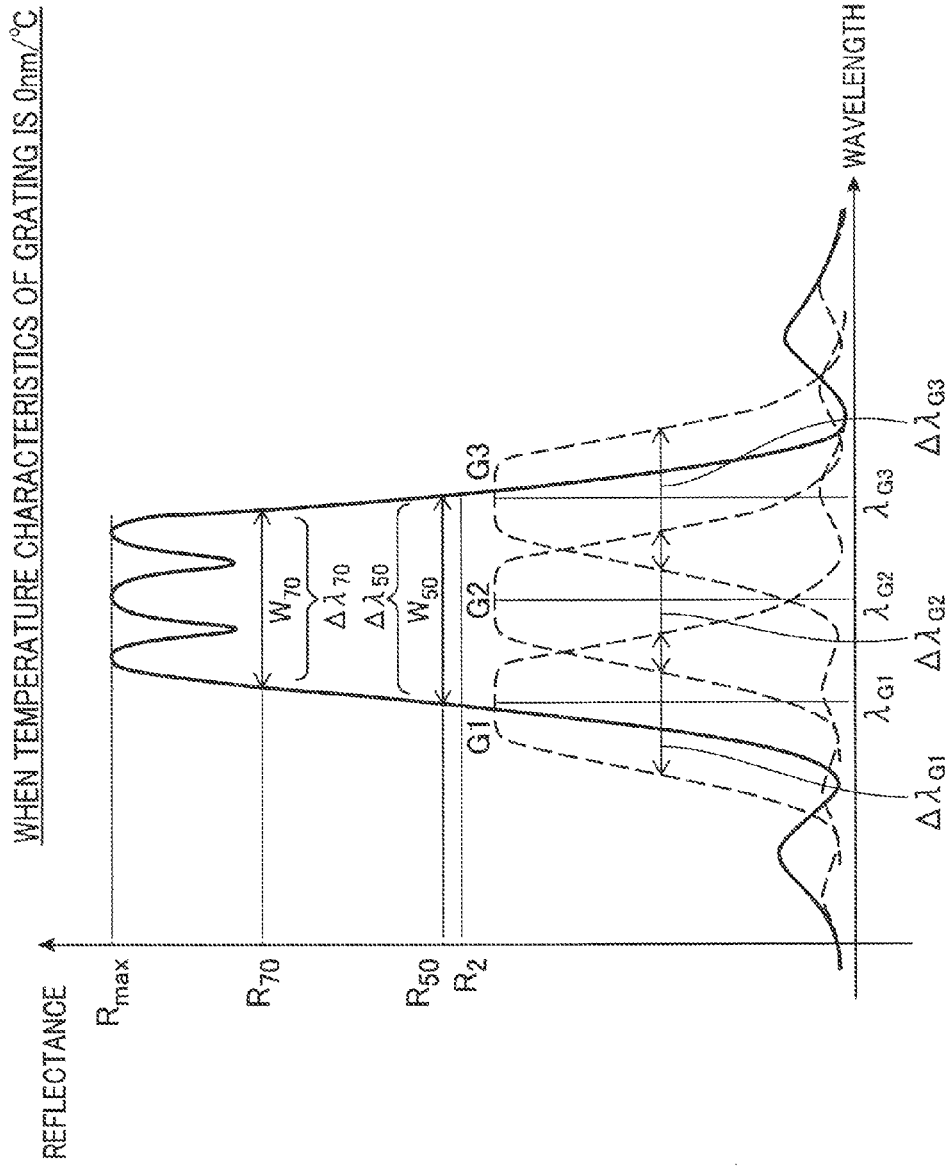

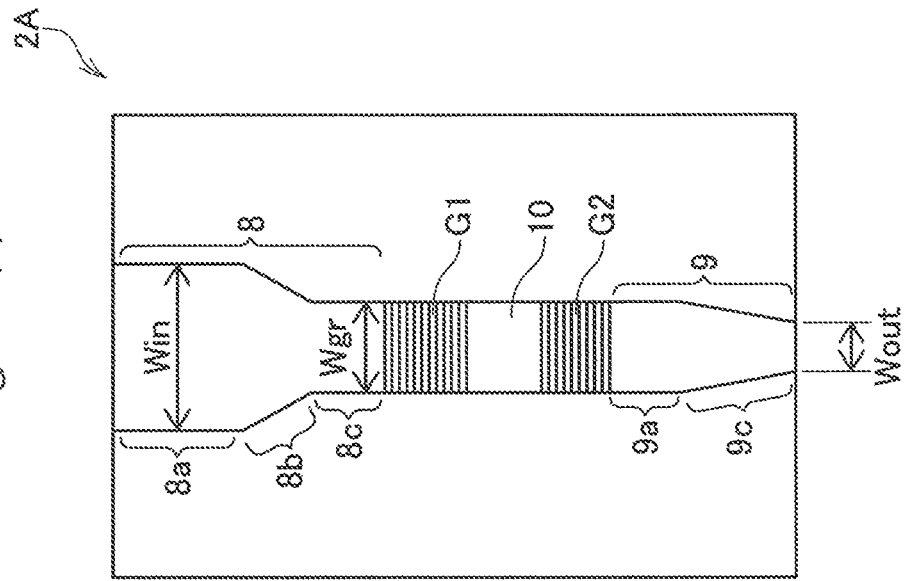
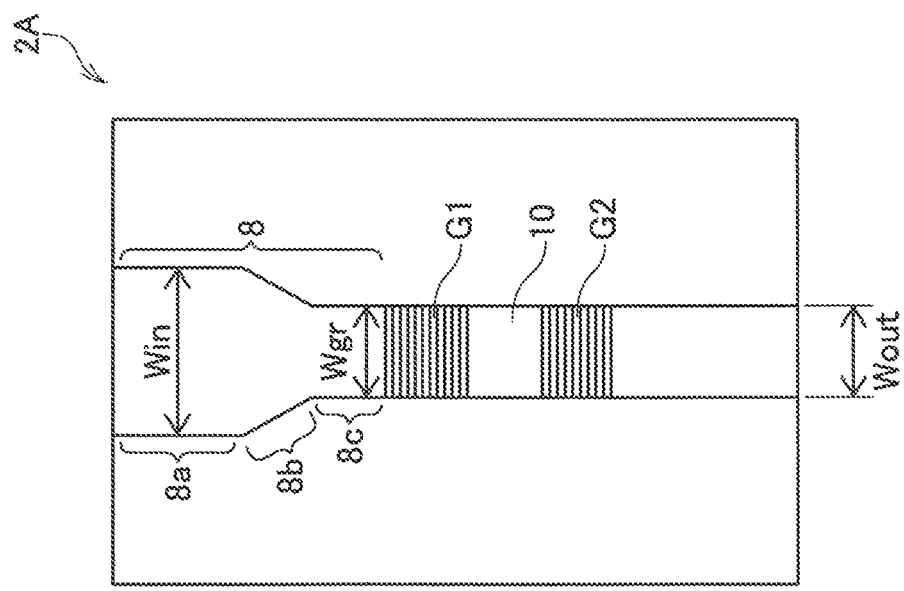

EXTERNAL-RESONATOR-TYPE LIGHT-EMITTING DEVICE

BACKGROUND OF THE INVENTION

1. Field of the Invention

The present invention relates to an external resonator type light-emitting device.

2. Description of Related Art

According to a DBR laser, concave and convex portions are formed on the surface of a waveguide extended from the waveguide of the active layer to configure a mirror by utilizing Bragg reflection for realizing a resonator. Since diffraction gratings are provided on both ends of an optical waveguide layer according to this laser, light emitted from the active layer is propagated through the optical waveguide layer; a part of the propagating light is reflected by the diffraction gratings and returned into a current injection part; and then amplified. As light having only a specific wavelength is reflected in the determined direction from the diffraction grating, the wavelength of the laser light is made constant.

According to a DBR laser formed monolithically in a semiconductor substrate, gratings are formed on an extension of the waveguide of the active layer. Heat generated in the active layer is directly conducted to the grating parts and current-injection electrons are injected into the grating parts, resulting in a large deviation of a refractive index, so that the wavelength and power are fluctuated responsive to temperature fluctuation. It has thus been common to perform temperature control with a Peltier device or the like.

Further, as the application, an external resonator type semiconductor laser, for which diffraction gratings are used as parts different from the semiconductor, and an external resonator is formed, has been developed. This type of laser provides lasers each exhibiting excellent wavelength stability, temperature stability and controllability. The external resonator includes a fiber Bragg grating and a volume holographic grating (VHG).

According to Patent document 1 (Japanese Patent Publication No. 2010-171252A), it is disclosed an external resonator type laser device including an optical waveguide and a grating formed in the optical waveguide, in which the optical waveguide has a core made of SiO2, SiO1-xNx (x represents 0.55 to 0.65) or Si and SiN. The external resonator type laser can maintain its oscillation wavelength constant without using precise temperature control, and for this, it is required to lower the change rate of reflection wavelength of the grating (temperature coefficient of the Bragg reflection wavelength). It is further described that stability of power can be realized by making the laser oscillation in longitudinal and multi mode.

According to Patent document 2 (Japanese patent No. 3667209B), it is disclosed an external resonator type laser including an optical waveguide and a grating formed in the optical waveguide made of quartz, InP, GaAs, LiNbO3, LiTaO3 or polyimide resin. It is further described that a reflectance at an emitting face of a semiconductor laser as a light source is an effective reflectance Re (substantially 0.1 to 38.4 percent), and that the laser oscillation is further performed in longitudinal and multi mode to realize stability of power.

The applicant proposed structures of external resonator type light emitting devices for reducing mode hopping due to temperature change, in patent document 3 (WO 2014-196553A and patent document 4 (Japanese patent No. 5641631B).

Further, as described in patent document 5, it can be considered that a grating device can be used in a wide temperature range by providing a plurality of Bragg gratings in the grating device. In this case, a length of the grating device is conventionally longer than 1 mm, and the wavelength range (full width at half maximum FWHM) of reflectance is set at a value of 1 nm or less. It is further described that it could be provided an external resonator type laser having improved wavelength stability with the mode hopping reduced.

According to patent document 6, it is disclosed an external resonator type light emitting device including a light source oscillating a semiconductor laser light and a plurality of Bragg gratings having different periods. The reflection characteristics of these Bragg gratings are independent from each other, do not overlap with each other, and its reflection characteristics are not continuous over a wide wavelength range. Further, according to the device, a grating and a region of adjusting phases are formed on the side of the light source to utilize the action of the phase-adjusting region to make the wavelength variable. The stability of the wavelength can be thereby realized upon the change of temperature.

[Non-patent document 1] Furukawa Review No. 105, pp. 24-29, January 2000
[Non-patent document 2] Handbook of Semiconductor Lasers and Photonic Integrated Circuit, pp. 363-374, 1994, edited by Y, Suematsu and A. R. Adams
[Patent document 1] JP 2010-171252A
[Patent document 2] JP 3667209B
[Patent document 3] WO 2014/196553 A
[Patent document 4] JP 5641631B
[Patent document 5] JP 2002-006148 A
[Patent document 6] US 2003-0108081 A1

SUMMARY OF THE INVENTION

However, in actuality, there is a limit on the improvement of temperature stability of the whole of the external resonator type light emitting device, and it may be required a mechanism of temperature control such as a Peltier device in many cases. Particularly, it is difficult to respond to a wide range of temperature change by means of an external resonator type light emitting device. It is thus desired to further improve the stability on the temperature change of the laser light source.

An object of the present invention is, in an external resonator type light emitting device utilizing a grating device, to provide a structure of improving stability with respect to temperature change.

The present invention provides an external resonator type light-emitting device comprising a light source oscillating a semiconductor laser light and a grating element configuring an external resonator together with said light source:

wherein said light source comprises an active layer oscillating said semiconductor laser light;

wherein said grating element comprises an optical waveguide and a plurality of Bragg gratings formed in said optical waveguide, said optical waveguide comprising an incident face to which said semiconductor laser light is incident and an emitting face from which an emitting light having a desired wavelength is emitted, and said Bragg gratings having periods different from each other;

wherein a half value reflectance $R_{50}$ is larger than a reflectance $R_2$ at an emitting end of said light source, wherein the half value reflectance $R_{50}$ is 3% or larger, and wherein a combined reflectance is not less than said half value reflectance $R_{50}$ in a wavelength region $\Delta\lambda_{50}$, said wavelength region $\Delta\lambda_{50}$ being continuous over 10 nm or more and 30 nm or less, provided that the half value reflectance $R_{50}$ is defined as 50 percent of a maximum value Rmax of a combined reflectance of said Bragg gratings.

According to the present invention, it is provided a plurality of Bragg gratings whose periods (pitches) are different from each other in a grating device.

Here, in the case that a plurality of the Brag gratings with different periods (pitches) are simply connected in serial to operate them, since the resonator lengths of the gratings are considerably different from each other, the mode hop intervals are considerably different. Thus, in the case that the laser oscillation is performed at a small resonator length, the mode hopping hardly occurs and the wavelength is stabilized even under temperature change. However, in the case that the resonator length is large, as the mode hop interval becomes small so that the mode hopping would easily occur and the stability on the wavelength is deteriorated.

Thus, the inventors have variously studied the wavelength characteristics of the reflectance of the Brag gratings with different periods (pitches) on the wavelength. Such study has not been adequately performed in prior external resonator type light emitting devices utilizing grating elements.

During the course of this study, it is noticed the importance of a combined reflectance, which is obtained by synthesizing the reflectances of Bragg gratings with different periods (pitches). The inventors have then found that the stability on wavelength can be improved, by making the combined reflectance larger than the reflectance at the emitting end of the light source and by providing the wavelength region $\Delta\lambda_{50}$ continuously and in a wide range, provided that the combined reflectance is not less than $R_{50}$, which is 50% of the maximum value Rmax of the combined reflectance in the wavelength region $\Delta\lambda_{50}$. The inventors thus reached the idea of enlarging the wavelength region.

The oscillation of laser from an external resonator type light emitting device by the Bragg grating takes place, where the gain of light returning into the light source after reflected by the Bragg grating is larger than the gain of the light returning into the light source after reflected at the emitting end of the light source, at a wavelength exceeding the oscillation threshold value. Then, when the environmental temperature is changed, the wavelength of laser light oscillating from the light source is shifted. At this time, the wavelength region $\Delta\lambda_{50}$ is made continuous in a wide range, provided that the combined reflectance of the Bragg gratings is not less than 50 percent $R_{50}$ of the maximum value Rmax in the wavelength region $\Delta\lambda_{50}$. As a result, when the peak wavelength of the gain of the light source is shifted, responsive to the shift, the Bragg gratings function as a whole so that the gain of light reflected by the Bragg gratings constantly exceeds the gain of light reflected at the emitting end of the light source. The laser oscillation of the external resonator type can be thus made possible. The stability on the temperature as whole device can be considerably improved, and attained the present invention.

BRIEF DESCRIPTION OF THE DRAWINGS

FIG. 8 is a wavelength characteristic diagram for illustrating the concept of the present invention.

FIG. 9 is a wavelength characteristic diagram for illustrating the concept of the present invention.

FIGS. 18(a) and 18(b) each are a view schematically showing a planar form of a grating element according to the present invention.

DETAILED DESCRIPTION OF THE INVENTION

Figure 1:
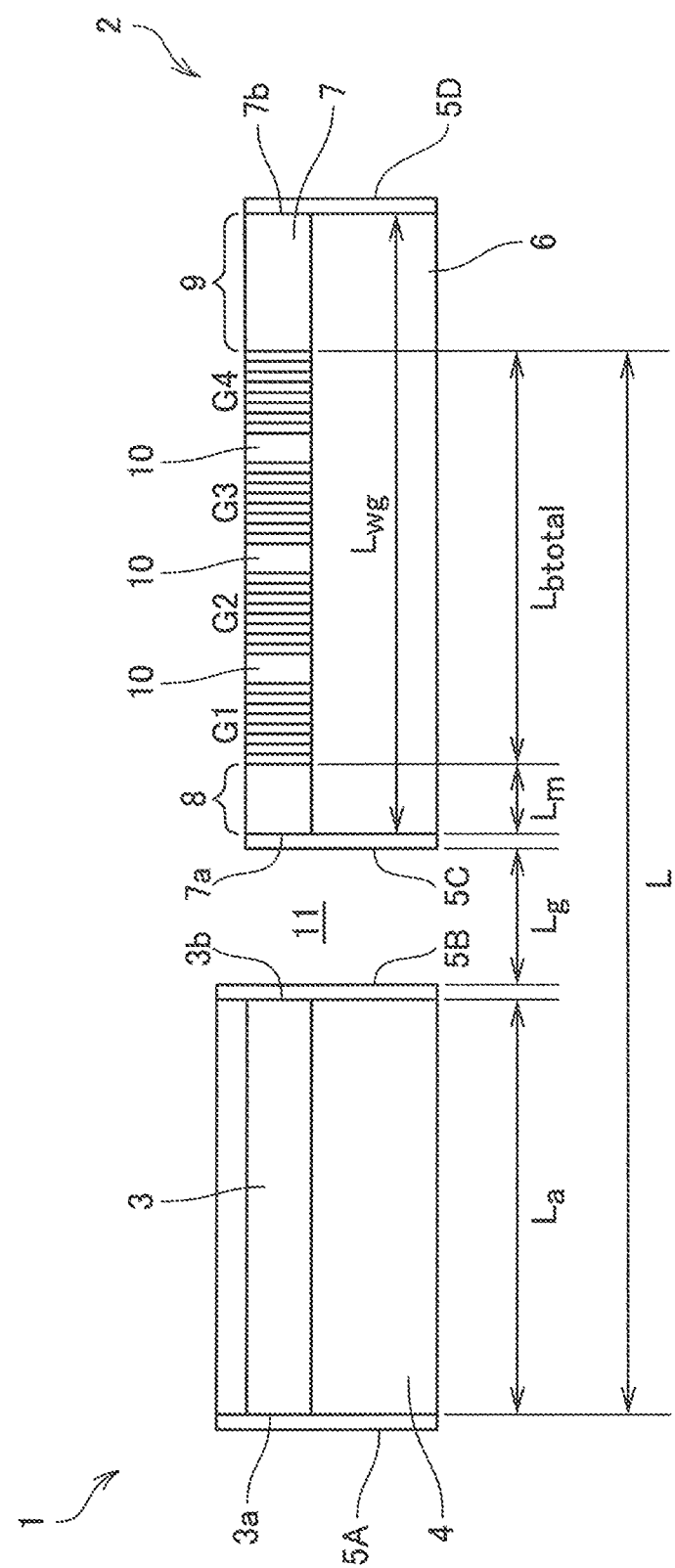
FIG. 1 is a view schematically showing an external resonator type light-emitting device.

An external resonator type light-emitting device schematically shown in FIG. 1 includes a light source 1 oscillating a semiconductor laser light, and a grating element 2. The light source 1 and the grating element 2 may be mounted on a common substrate not shown in the figure.

The light source 1 includes an active layer 3 oscillating the semiconductor laser light. According to the present embodiment, the active layer 3 is provided on a substrate 4. A reflection film 5A is provided on an outer end face 3a of the active layer 3, and an antireflection film 5B is formed on an end face 3b on the grating element side of the active layer 3. Symbol La represents the length in the direction of an optical axis of the active layer.

In the grating element 2, it is provided an optical waveguide 7 including an incident face 7a to which the semiconductor laser light is incident and an emitting face 7b from which emission light having a desired wavelength is emitted, on a supporting substrate 6. A plurality of Bragg gratings G1, G2, G3 and G4 are formed in the optical waveguide 7. According to the present example, the number of the Bragg gratings is 4, but may be 2 or more. Each of intermediate propagating portions 10, which has no diffraction grating, is provided between the Bragg gratings adjacent to each other.

An incident side propagating portion 8 having no diffraction grating is provided between the incident face 7a of the optical waveguide 7 and the Bragg grating G1, and the incident side propagating portion 8 and the active layer 3 are facing to each other via a spacing 11. Symbol 5C represents an antireflection film provided on the incident face side of the optical waveguide 7. An emitting side propagating portion 9 having no diffraction grating is provided between the emitting face 7b of the optical waveguide 7 and the Bragg grating G4, and symbol 5D represents an antireflection film provided on the emitting face side of the optical waveguide 7.

Figure 2:
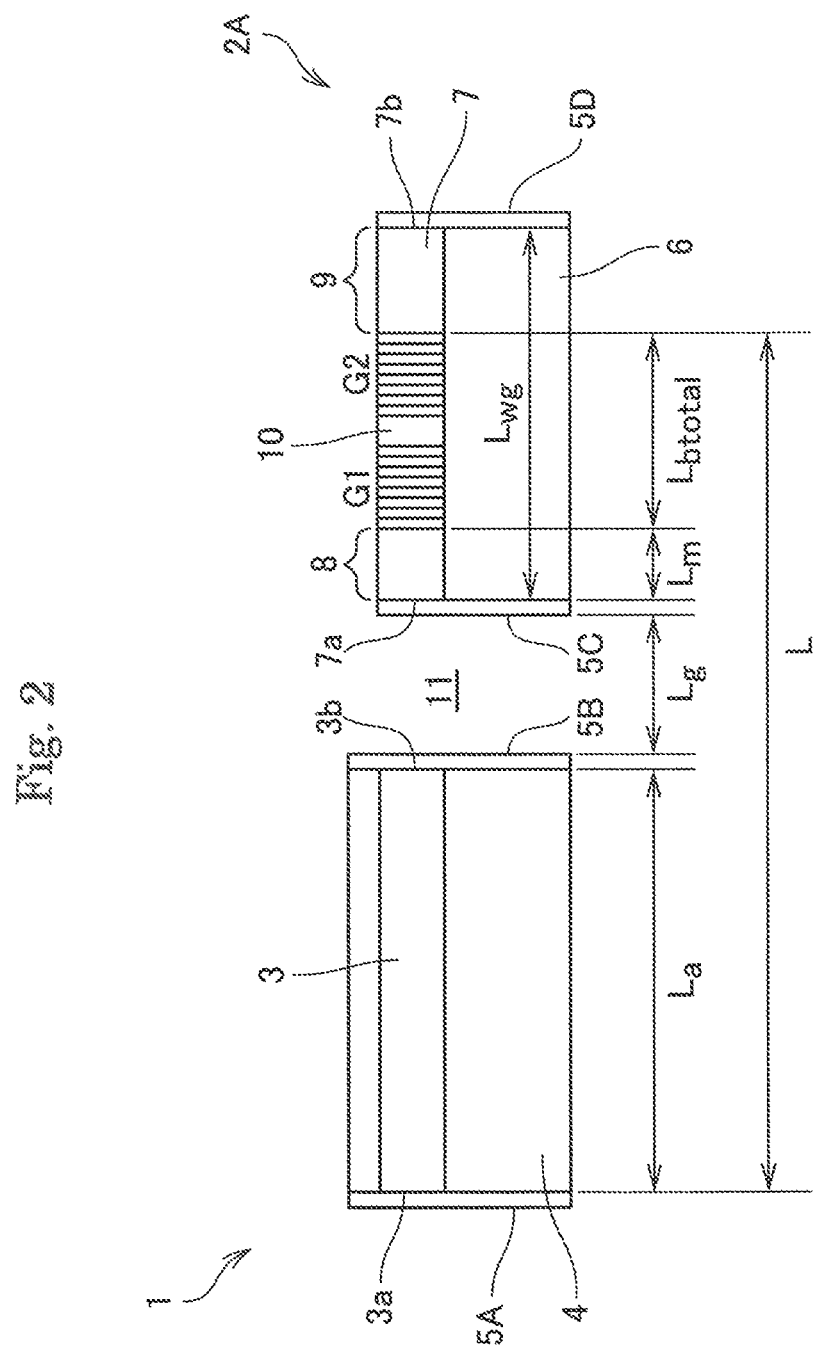
FIG. 2 is a view schematically showing another external resonator type light-emitting device.

The light-emitting device shown in FIG. 2 is mostly identical to the light-emitting device shown in FIG. 1. However, in a grating element 2A shown in FIG. 2, two Bragg gratings G1 and G2 are provided between the incident side propagating portion 8 and the emitting side propagating portion 9 of the optical waveguide 7, and an intermediate propagating portion 10 having no diffraction grating is provided between the Bragg gratings G1 and G2 adjacent to each other.

Figure 3:
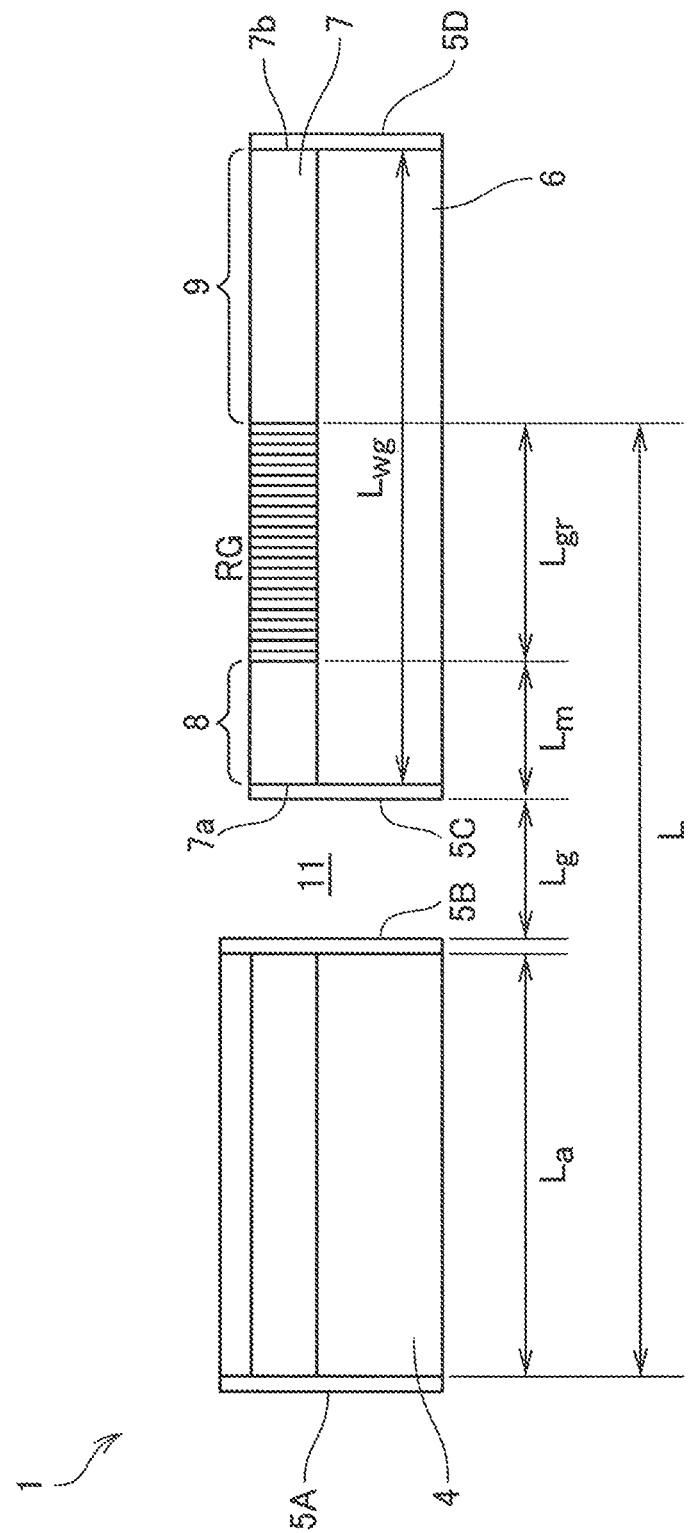
FIG. 3 is a view schematically showing an external resonator type light-emitting device as a contrasting example.

FIG. 3 is a view schematically showing a light-emitting device as a contrasting example. In the case of the grating element in the present device, an integrated Bragg grating RG is provided between the incident side propagating portion 8 and the emitting side propagating portion 9 of an optical waveguide 7.

According to the examples as described above, an intermediate propagating portion having no grating is provided between the Bragg gratings adjacent to each other. However, the Bragg gratings each having a different central wavelength may be provided continuously with no intermediate propagation portion between them.

Figure 4:
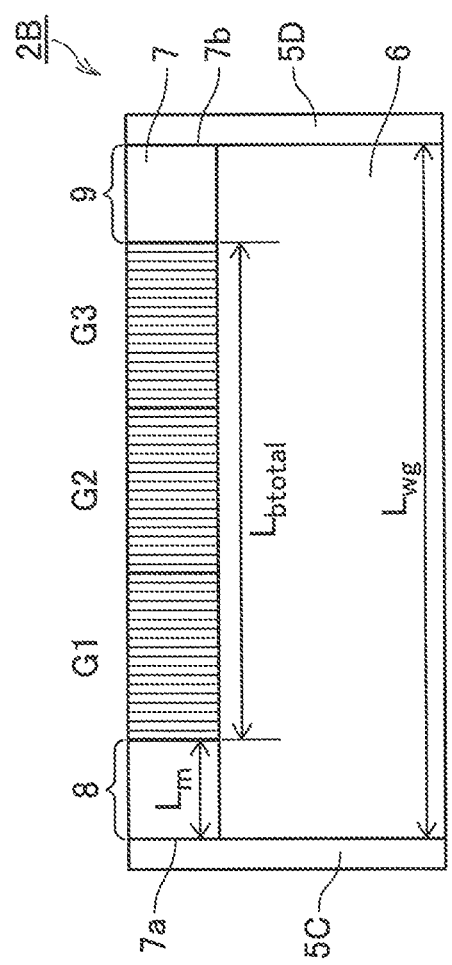
FIG. 4 is a view schematically showing another grating device 2B.

That is, according to a Bragg grating device 2B shown in FIG. 4, three Bragg gratings G1, G2, G3 are provided between the incident side propagation portion 8 and the emitting side propagation portion 9 of the optical waveguide. It is not provided an intermediate propagation portion without a diffraction grating between the adjacent Bragg gratings G1 and G2, and G2 and G3, respectively, and the adjacent Bragg gratings are continuously formed.

Figure 5:
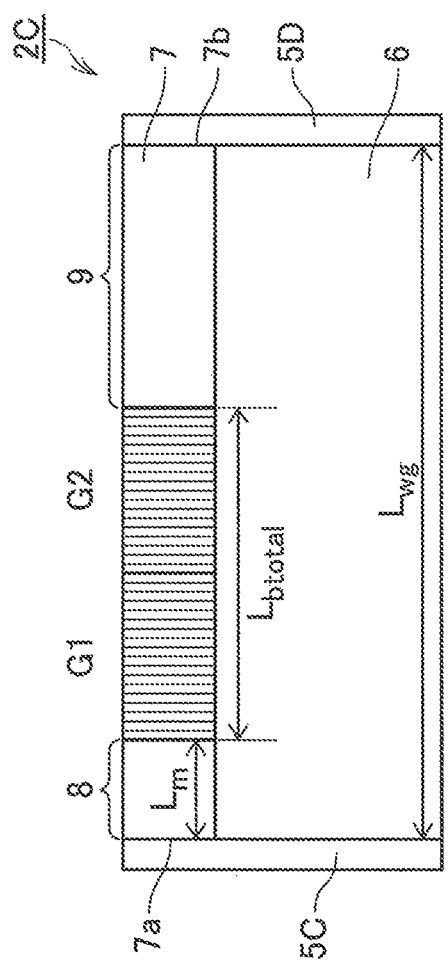
FIG. 5 is a view schematically showing another grating device 2C.

According to a Bragg grating device 2C shown in FIG. 5, two Bragg gratings G1, G2 are provided between the incident side propagation portion 8 and the emitting side propagation portion 9 of the optical waveguide. It is not provided an intermediate propagation portion without a diffraction grating between the adjacent Bragg gratings G1 and G2, and the adjacent Bragg gratings are continuously formed.

Figure 6:
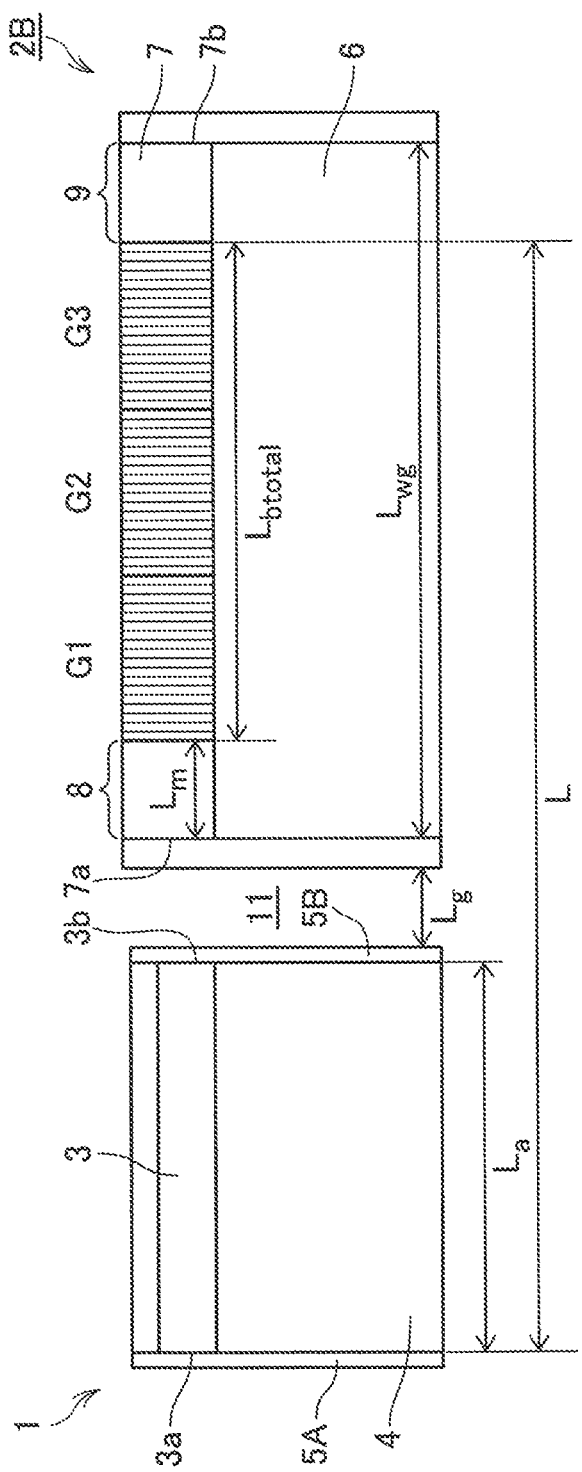
FIG. 6 is a view schematically showing another external resonator type light-emitting device.

According to FIG. 6, as the example of FIG. 1, the grating device 2B and light source 1 together constitute the external resonator type light emitting device. However, the same parts shown in FIG. 1 are designated by using the same numerals, and the explanation may be omitted.

Further, according to the present invention, it is provided a plurality of Bragg gratings whose periods are different from each other. However, it is permitted to provide one or more of Bragg grating whose period is same as one of the plurality of these Bragg gratings.

The operation of the device according to the present invention will be explained below.

The upper side of FIG. 8 shows the dependency of the gain of semiconductor laser light on wavelength, and the lower side of FIG. 8 shows wavelength characteristics of the combined reflectance of three Bragg gratings G1, G2 and G3.

According to the present invention, a plurality of Bragg gratings each have a different period (pitch). As a result, the wavelength characteristics of reflectance at each Bragg grating become different from each other. For example, according to the example of FIGS. 8 and 9, the wavelength characteristics of the reflectances of the three Bragg gratings G1, G2 and G3 are different from each other.

Figure 7:
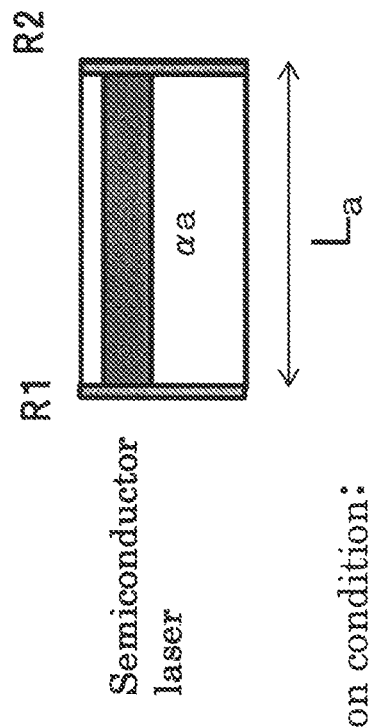
FIG. 7 is a view schematically showing a laser oscillation condition.

That is, as shown in FIGS. 7 and 8, $g_{th}$ is assigned to the oscillation threshold value and $\Delta\lambda_{LDg}$ is assigned to the full width at half maximum of the gain. On the other hand, the central wavelengths of the reflectances of the Bragg gratings G1, G2 and G3 are designated as $\lambda_{G1}$, $\lambda_{G2}$ and $\lambda_{G3}$, respectively (FIG. 9), and the full widths at half maximum of the reflectances of the Bragg gratings are designated as $\Delta\lambda_{G1}$, $\Delta\lambda_{G2}$ and $\lambda\Delta_{G3}$, respectively. Further, the reflectance at the emitting end of the light source is designated as $R_2$.

Further, the maximum value of the combined reflectance of the three Bragg gratings is designated as Rmax, and the reflectance of 50 percent of the maximum reflectance is designated as $R_{50}$. Further, the whole width of wavelength of the wavelength region in which the reflectance is $R_{50}$ or more is designated as $\Delta\lambda_{50}$, and its central wavelength is designated as $\lambda_{GC}$.

Here, there is present a wavelength region in which the combined reflectance of the Bragg gratings exceeds the reflectance $R_2$ at the emitting end of the light source. The Bragg gratings G1, G2 and G3 are elements for obtaining the combined reflection characteristics. There may be or may not be a wavelength region in which the reflectance of each of the Bragg gratings exceeds the reflectance $R_2$ at the emitting end of the light source.

Further, according to the present example, the wavelength regions $\lambda_{G1}$, $\Delta\lambda_{G2}$, and $\Delta\lambda_{G3}$ of the adjacent Bragg gratings are partly overlapped with each other.

In other words, the graphs of the reflectances of the Bragg gratings are intersected with each other at values over reflectances corresponding to $\lambda_{G1}$, $\Delta\lambda_{G2}$ and $\Delta\lambda_{G3}$, respectively.

The oscillation wavelength of laser light is determined with the wavelength reflected by the grating. If light reflected by the grating exceeds the gain threshold value of the laser, the oscillation condition is satisfied. By making it larger than the gain of the light reflected at the end face of the active layer on the grating element side, the laser oscillation can thereby be facilitated further. Thus, the laser light that exhibits high wavelength stability can be obtained.

In order to achieve higher wavelength stability, a feedback amount from the grating may be increased, and from this viewpoint, reflectance of the grating is set to be larger than reflectance at the end face of the active layer. Consequently, the gain obtained by a resonator provided with the grating becomes larger than that of a resonator of an original semiconductor laser, and thus stable laser oscillation becomes possible with the resonator provided with the grating.

From this result, when the oscillation wavelength of the light source is shifted in response to temperature changes, oscillation in the wavelength region $\Delta\lambda_{50}$ of the combined reflectance of the Bragg gratings is secured. As a result, in the case the wavelength of laser oscillation is shifted responsive to the temperature change, the laser oscillation is stabilized at the shifted wavelength, so that the stability of the power of the laser oscillation can be considerably improved.

According to the present invention, $R_{50}$ is larger than the reflectance $R_2$ at the emitting end of the light source. On the viewpoint, $R_{50}/R_2$ may preferably be 1.01 or higher and more preferably be 1.05 or higher. On the viewpoint of improving the stability on wavelength and power, $R_{50}/R_2$ may preferably 1.2 or higher.

As to the combined reflection characteristics of the Bragg gratings, there is the wavelength region in which $R_{50}$ is not less than the reflectance $R_2$ at the emitting end of the light source continuously. At this time, a difference between the upper and lower limits of the continuous wavelength region may preferably be 10 n or larger and more preferably be 12 nm or larger.

Further, the wavelength region $\Delta\lambda_{50}$, in which the combined reflectance is not less than the half value reflectance $R_{50}$, may preferably be continuous in 10 nm or longer and 30 nm or shorter. The region may preferably be continuous in 12 μm or longer, and in 25 nm or shorter.

The half value reflectance $R_{50}$ is made 3% or larger, so that stable oscillation is made possible. The half value reflectance $R_{50}$ may preferably be 5% or higher and more preferably be 7% or higher. Although the upper limit of the half value reflectance $R_{50}$ is not particularly limited, it may be 60% or less.

For making $\Delta\lambda_{50}$ in the numerical range as described above, the wavelength width (full width at half maximum) of the wavelength region, in which the reflectance is not less than 50 percent of the maximum value of the reflectance of each Bragg grating, may preferably be 5 nm or larger and more preferably be 10 nm or larger. On the other hand, the upper value may preferably be 30 nm or smaller and more preferably be 25 nm or smaller.

On the viewpoint of improving the tolerance of the stability of wavelength and power of the laser oscillation, the full width at half maximum $W_{50}$ of the combined reflectance of the Bragg gratings may preferably be larger.

The minimum value $R_{Gmin}$ of grating reflectance necessary for laser oscillation in an external resonator mode is a minimum reflectance required for satisfying a gain threshold value of an external resonator formed by a semiconductor laser and gratings. The gain threshold value of the external resonator is determined by the after-mentioned mathematical formula (2-1). In comparison to the case of only the semiconductor laser shown in FIG. 7, a coupling efficiency of a semiconductor laser and a grating element, and any loss of a grating element unit or the like each becomes a factor that decreases the gain. For this reason, the lowest reflectance $R_{Gmin}$ for laser oscillation in the external resonator mode is conventionally set to be larger than reflectance $R_2$ at the emitting end of the semiconductor laser. However, in cases where the coupling efficiency is 100% with no loss, $R_{Gmin}=R_2$ is obtained. It is thus preferred that $R_{50}$ is not less than $R_{Gmin}$.

The full width at half maximum $\Delta\lambda_{50}$ can be determined in response to the gain curve of the semiconductor laser light source.

For obtaining a desired value of the full width at half maximum $\Delta\lambda_{50}$, the interval between the central reflection wavelengths of the Bragg gratings is an important parameter. That is, according to a preferred embodiment, the interval between the adjacent reflection central wavelengths may preferably satisfy the following.

$$4 \text{ nm} \leq \lambda_{G(n+1)} - \lambda_{G(n)} \leq 20 \text{ nm}$$

Here, ($\lambda_{G(n+1)} - \lambda_{G(n)}$) means an interval of the central wavelengths of the gratings adjacent to each other in the axis of wavelength.

The interval $\Delta\Lambda((n+1)-(n))$ of the period (pitch) of the Bragg gratings can be expressed as follows.

$$\Delta\Lambda((n+1)-(n)) = \frac{1}{2} n_{eff} \times [\lambda_{G(n+1)} - \lambda_{G(n)}]$$

Here, $n_{eff}$ means an equivalent refractive index (effective refractive index).

In the case that $n_{eff}$ is 2, $\Delta\Lambda((n+1)-(n))$ may preferably be as follows.

$$1 \text{ nm} \leq \Delta\Lambda((n+1)-(n)) \leq 5 \text{ nm}$$

As such, according to the Bragg gratings with different periods (pitches), a sum $\Sigma(\Delta\lambda_{G(n)})$ of the full widths at half maximum of the Bragg gratings is larger than the full width at half maximum $\Delta\Lambda_{50}$ of the combined reflectance. On the viewpoint of the stability on temperature and of power of laser oscillation, the following conditions are preferably satisfied.

$$\Delta\Lambda_{50} \leq =0.7 \times \Sigma(\Delta\lambda_{G(n)})$$

The number n of the Bragg gratings is 2 or more. Although the upper limit is particularly defined, as n is larger, the total length of the Bragg gratings becomes larger. Thus the number n may preferably be 10 or less.

It is preferred that the length of each Bragg grating is 3 μm or larger. After the gratings having different periods, it may be provided a grating having a period same as one of them.

As to the combined reflection characteristics of the Bragg gratings, it is preferred that the flatness of the peak is high on the viewpoint of stability of power. For this, it was found that the wavelength region $\Delta\Lambda_{70}$, in which the reflectance is 70% or higher of the maximum value Rmax of the reflectance, is made wider. The width of the wavelength region $\Delta\Lambda_{70}$ may preferably be 10 nm or larger. As the wavelength region is too wide, the mode hoping with a large deviation of wavelength may occur. $\Delta\Lambda_{70}$ may thus preferably be 25 nm or smaller.

For reducing the mode hoping with a larger deviation of wavelength, the combined reflection characteristics of the gratings may preferably have a plurality of peaks. It is thus possible to fix the laser oscillation wavelength at the wavelength of the peak. Further, by providing a plurality of the peaks, the mode hoping occurs into the adjacent peak and the reflectance is not substantially changed. The deviation of the wavelength due to the mode hoping is thus small, so that the deviation of power can be suppressed. On such viewpoint, the number of the peaks may preferably be 3 or more.

Further, although the positions of the gratings are not particularly limited, for example, the grating with a shorter period may be provided on the side of the input of the light source and the gratings with the longer periods may be provided in the order. By this, the resonator length of external resonator is gradually increased or decreased responsive to the temperature change, so that the mode hopping can be effectively reduced.

The reflectances and $\Delta\Lambda_{G(n)}$ of the Bragg gratings may be the same or different from each other. Thus, the lengths of the gratings may be different from each other, and any construction may be applied, as far as the combined gratings satisfy the above conditions.

The act of the present invention will hereinafter be described further.

For example, the temperature characteristic of a GaAs semiconductor laser exhibits 0.3 nm/t, and when the temperature increases by 10° C., the oscillation wavelength is shifted to the long wavelength side by 3 nm. ΔλLDg is different depending on semiconductor lasers, but is generally a value ranging from approximately 4 nm to 10 nm.

The temperature operation range can be obtained by dividing the difference of central wavelengths of the gain of a semiconductor laser between at Tmin and at Tmax by temperature characteristics. This wavelength difference is one obtained by adding the wavelength region ΔΛ50 and Δλlow and Δλhigh to the shorter wavelength side and longer wavelength side of this wavelength regions, respectively. In this case, the temperature operation range is represented by:

$$\Delta T = \{\Delta\Lambda_{50} + \Delta\lambda low \text{ and } \Delta\lambda high\}/0.3 \text{ nm}/^\circ \text{ C.}$$

where the temperature shift of the reflection wavelength of a grating element is 0 nm/° C. In the case of a conventional laser, Δλlow and Δλhigh each are numerical values ranging from 2 nm to 3 nm (refer to FIG. 8).

For example, as described in FIG. 6, in cases where the three gratings G1, G2 and G3 are connected in series. In this case, $W_{50}$ are 21 nm respectively and the operational temperature range is about 83° C. to 93° C.

Further, when the temperature shift of the reflection wavelength of a grating element is 0.1 nm/° C., obtained is: $\Delta T = \{\Delta\Lambda_{50} + \Delta\lambda_{low} \text{ and } \Delta\lambda_{high}\}/(0.3-0.1)$ nm/° C., and in the case of FIGS. 8 and 9, the operation temperature range is from 125° C. to 140° C.

Figure 10A:
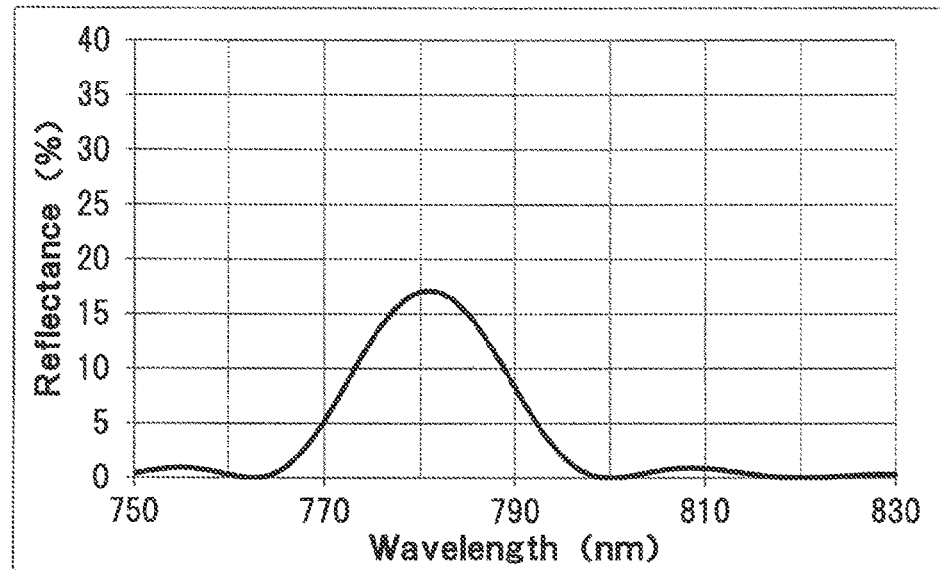
FIGS. 10 (a) and 10(b) are graphs each showing an example of characteristics of reflection of a single Bragg grating.
Figure 10B:
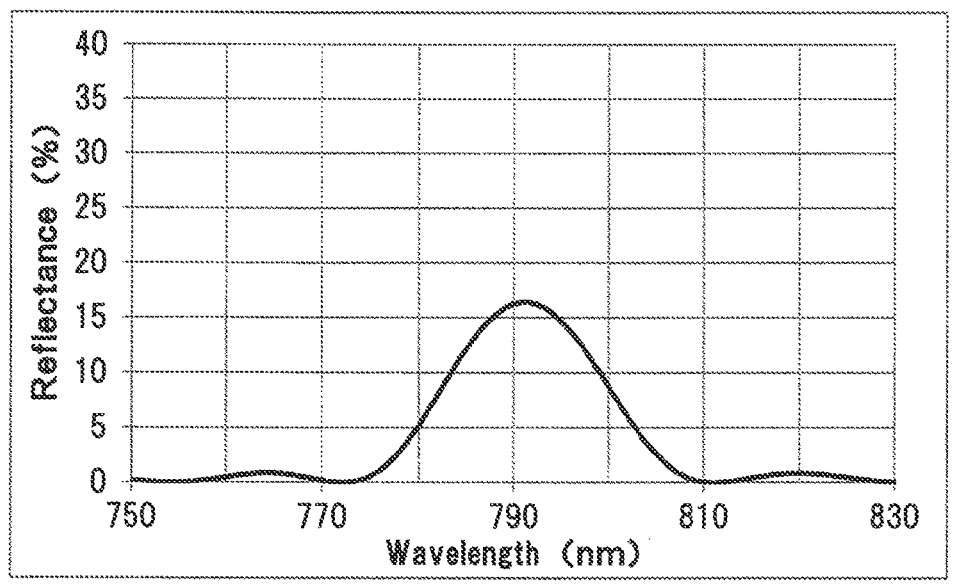
Figure 11A:
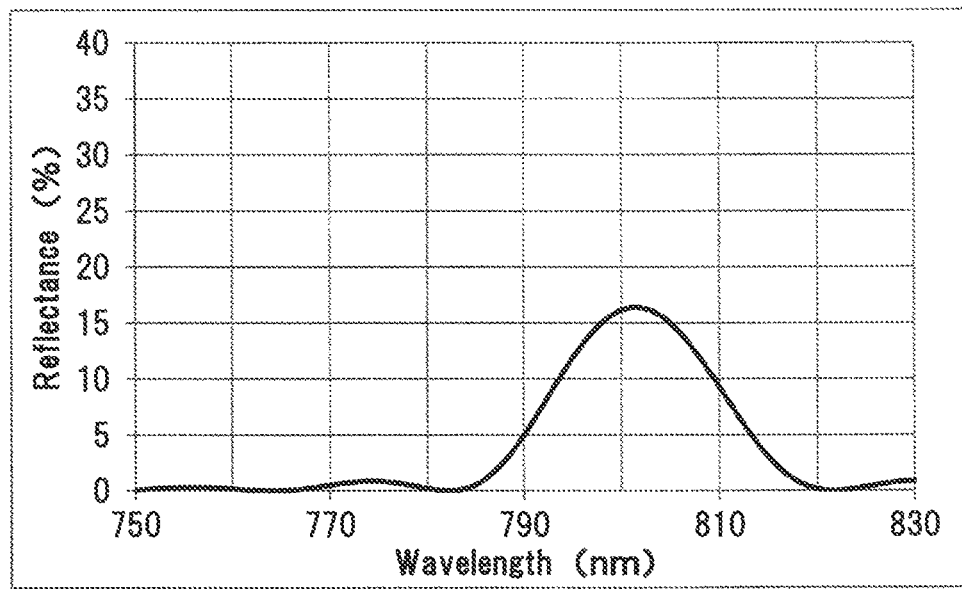
FIG. 11 (a) is a graph showing an example of characteristics of reflection of a single Bragg grating, and 11(b) is a graph showing an example of characteristics of a combined reflectance of three Bragg gratings.

According to a preferred embodiment, FIG. 6 shows a grating device having three gratings formed therein without a space between them. The periods of the Bragg gratings G1, G2 and G3 are 190 nm, 192.5 nm and 195 nm, respectively, in which it is shifted by 2.5 nm. In this case, the reflection characteristics of the Bragg gratings are shown in FIGS. 10(a), 10(b) and 11(a), respectively. Then, as shown in the drawings, the maximum reflectance Rmax was 16 to 17% and the full width at half maximum was about 18 nm.

Figure 11B:
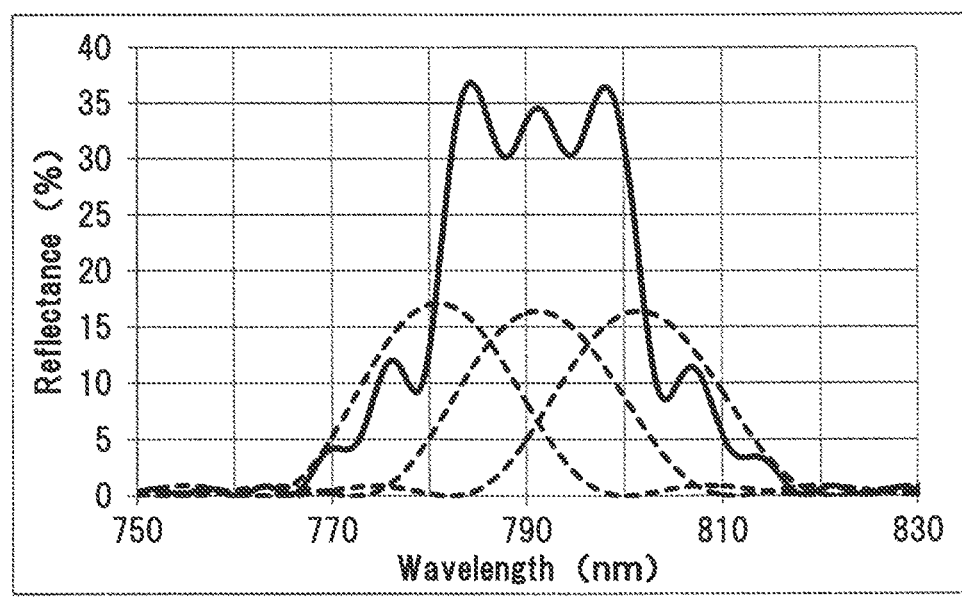

FIG. 11(b) shows a combined reflectance of the Bragg gratings. The maximum reflectance Rmax was about 37%, $R_{50}$ was about 18%, and the full width at half maximum $\Delta\Lambda_{50}$ was about 21 nm. Further, $R_{70}$ was about 25% and $\Delta\Lambda_{70}$ was about 20 nm.

Figure 12A:
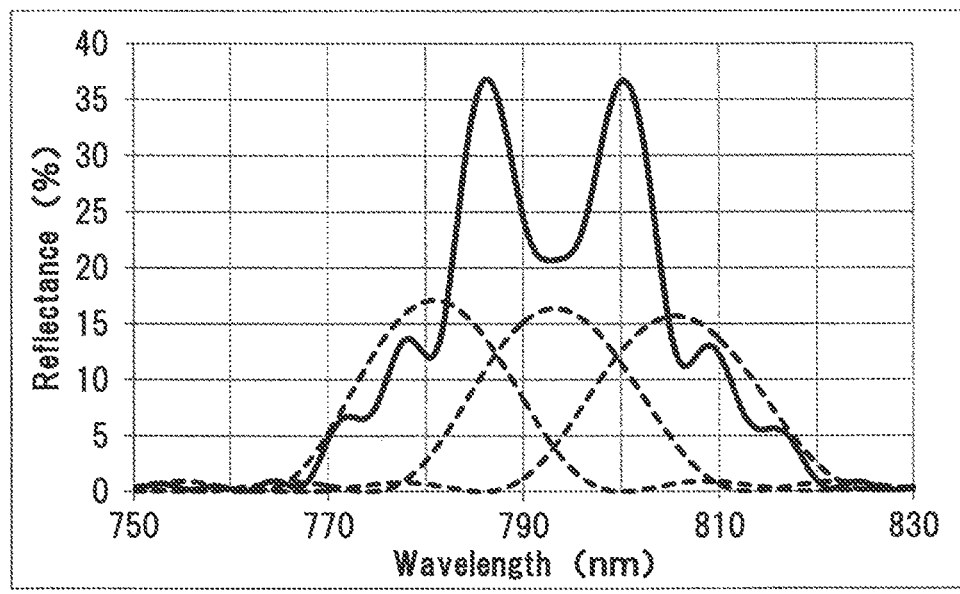
FIGS. 12(a) and 12(b) are graphs showing examples of characteristics of reflection of three Bragg gratings, respectively.

Further, the periods of the gratings G1, G2 and G3 were made 190 nm, 193 nm and 196 nm, respectively, in which the periods were shifted by 3 nm. FIG. 12(a) shows the resulting combined reflectance characteristics. In this case, the maximum reflectance Rmax was about 37%, $R_{50}$ was about 18%, and the full width at half maximum $\Delta\Lambda_{50}$ was about 22 nm. Further, $R_{70}$ was about 24% and $\Delta\Lambda_{70}$ was about 7 nm.

Figure 12B:
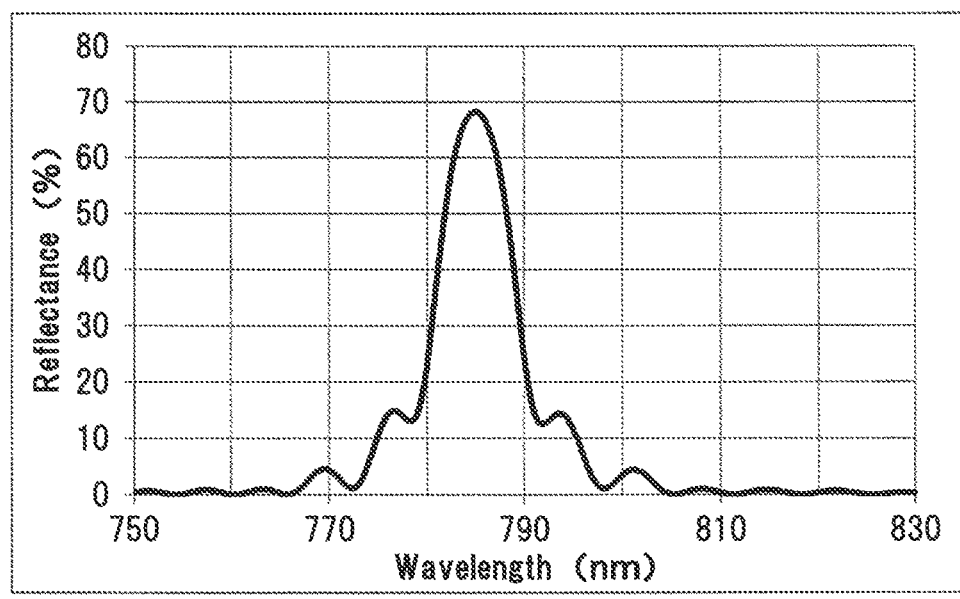

Further, the periods of the gratings G1, G2 and G3 were made 190 nm, 191 nm and 192 nm, respectively, in which the periods were shifted by 1 nm. FIG. 12(b) shows the resulting combined reflectance characteristics. In this case, the maximum reflectance Rmax was about 68%, $R_{50}$ was about 34%, and the full width at half maximum $\Delta\Lambda_{50}$ was about 8.5 nm. Further, $R_{70}$ was about 47% and $\Delta\Lambda_{70}$ was about 7 nm.

Figure 13A:
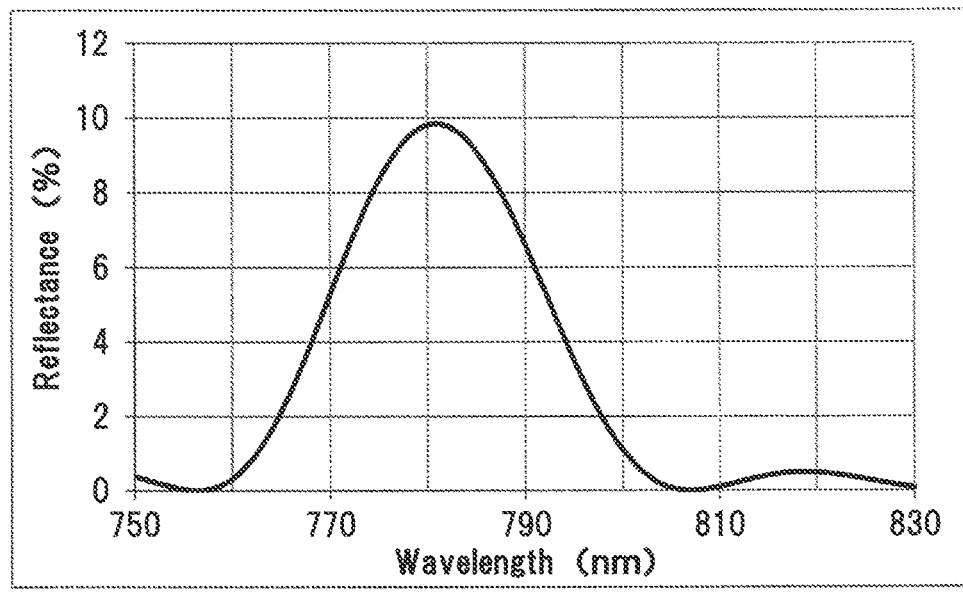
FIGS. 13(a) and 13(b) are graphs each showing an example of characteristics of reflection of a single Bragg grating.
Figure 13B:
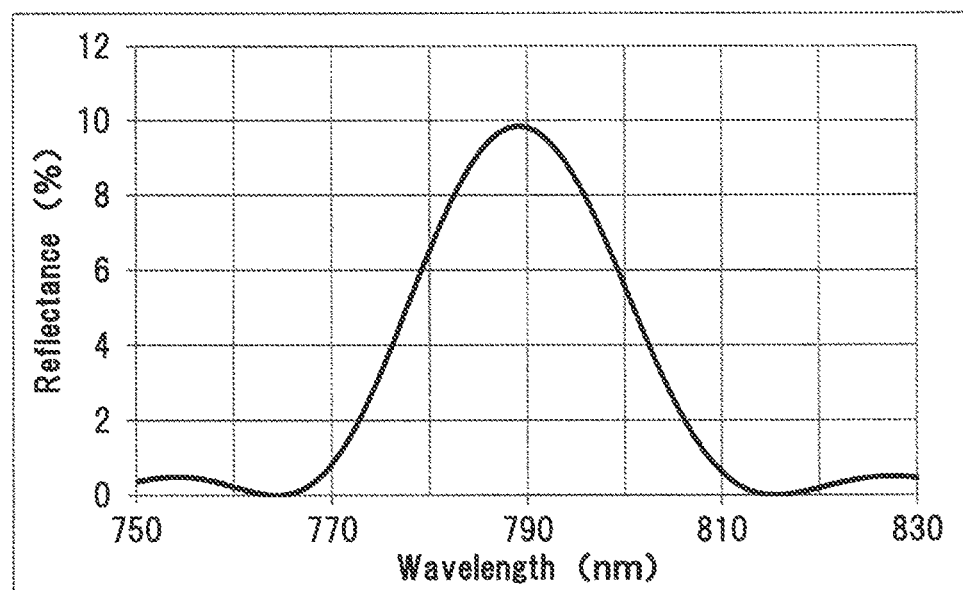

Next, FIG. 5 shows a grating device with two Bragg gratings without a space between them. The periods of the gratings G1 and G2 were made 190 nm and 191 nm, respectively, in which the periods were shifted by 1 nm. In this case, the reflection characteristics of the Bragg gratings are shown in FIGS. 13(a) and 13(b), respectively. In this case, the maximum reflectance Rmax was 10% and the full width at half maximum $\Delta\lambda_{50}$ was about 23 nm.

Figure 14A:
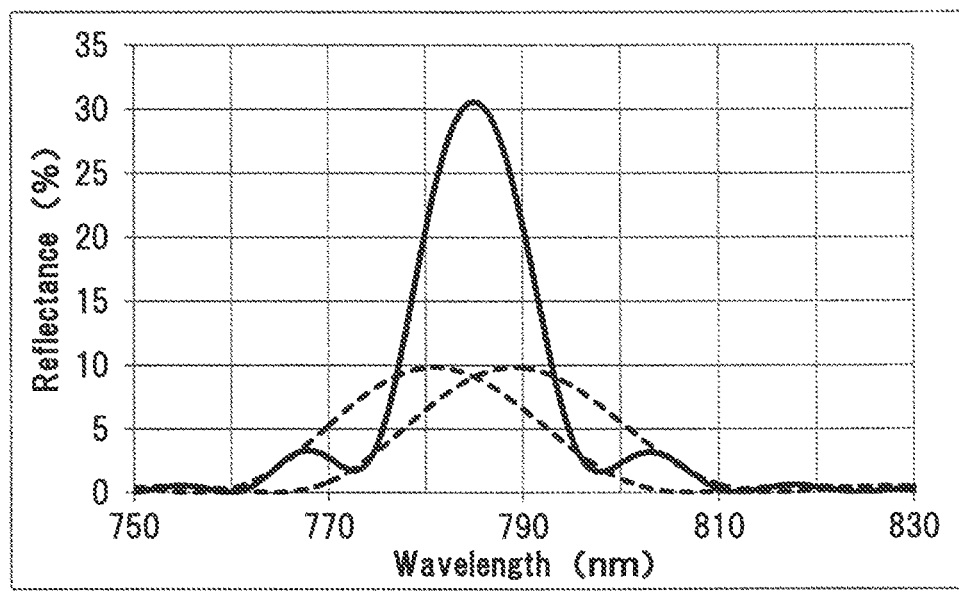
FIGS. 14(a) and 14(b) are graphs showing examples of characteristics of reflection of two Bragg gratings, respectively.

FIG. 14(a) shows the resulting combined reflectance characteristics of these Bragg gratings. In this case, the maximum reflectance Rmax was about 30%, $R_{50}$ was about 13%, and the full width at half maximum $\Delta\Lambda_{50}$ was about 13 nm. Further, $R_{70}$ was about 21% and $\Delta\Lambda_{70}$ was about 10 nm.

Figure 14B:
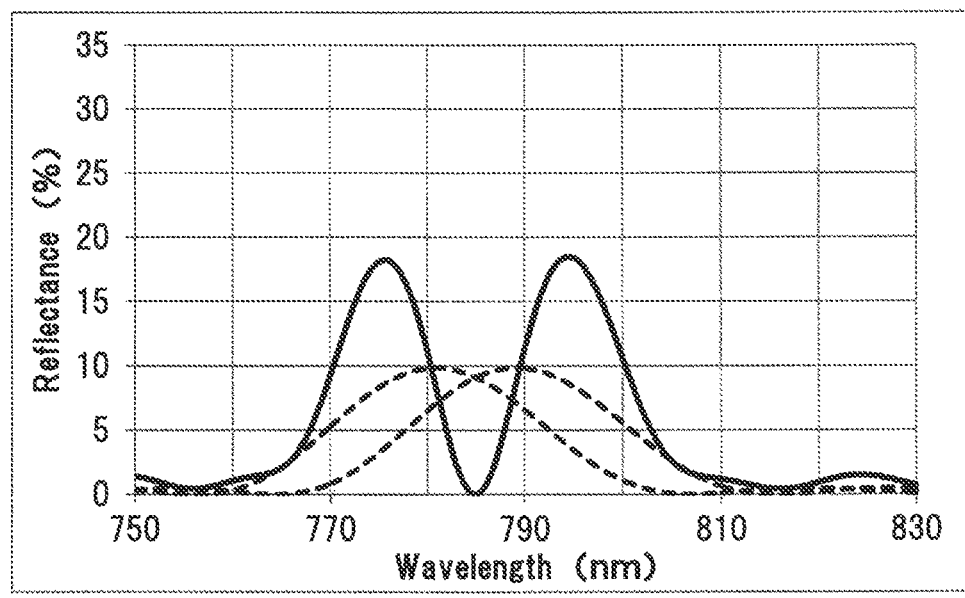

On the other hand, in the case of a grating device in which the distance between the gratings is made 95 nm in the above described two gratings. FIG. 14(b) shows the resulting combined reflectance characteristics. In this case, the maximum reflectance Rmax was about 18%, $R_{50}$ was about 9%, and the full width at half maximum $\Delta\Lambda_{50}$ was about 10 nm. Further, $R_{70}$ was about 12.6% and $\Delta\Lambda_{70}$ was about 8 nm.

It will be then described the definition and calculating method of the combined reflectance.

The combined reflectance means one obtained by combining the reflection characteristics of a plurality of gratings. The reflection characteristics of light diffracted by the grating is determined by the structure of the grating (depth, period, shape and length) and a refractive index of a material forming the grating. For example, the combined reflectance can be calculated by numerical calculation as shown in the non-patent document 2. Further, the combined reflectance can be calculated by electromagnetic field simulation utilizing Coupled-Mode theory.

According to these, the reflectance of the grating is represented by a complex number, and in the case that there is a plurality of gratings, the combined reflection characteristics is changed depending on the respective positions. That is, the reflection characteristics can be changed by changing the distance between the gratings.

According to a preferred embodiment, the optical waveguide 7 is a ridge type optical waveguide, and is provided in an optical material layer. In this case, the optical waveguide 7 may be formed on the same surface as that of the Bragg grating, or may be formed on a surface facing the Bragg grating.

The reflectances of the antireflection layers 5B, 5C and 5D each may be a value smaller than grating reflectance, and is more preferably 0.1% or less. However, if the reflectance at the end face is a value smaller than that of the grating reflectance, the antireflection layer may not be provided, but a reflection film may be provided. When a reflection film is formed instead of providing the antireflection layer on the end face on the grating element side of the active layer, this turns out to be a configuration of a conventional semiconductor laser. In this case, the light source becomes one which singly executes the laser oscillation by itself alone.

Figure 15A:
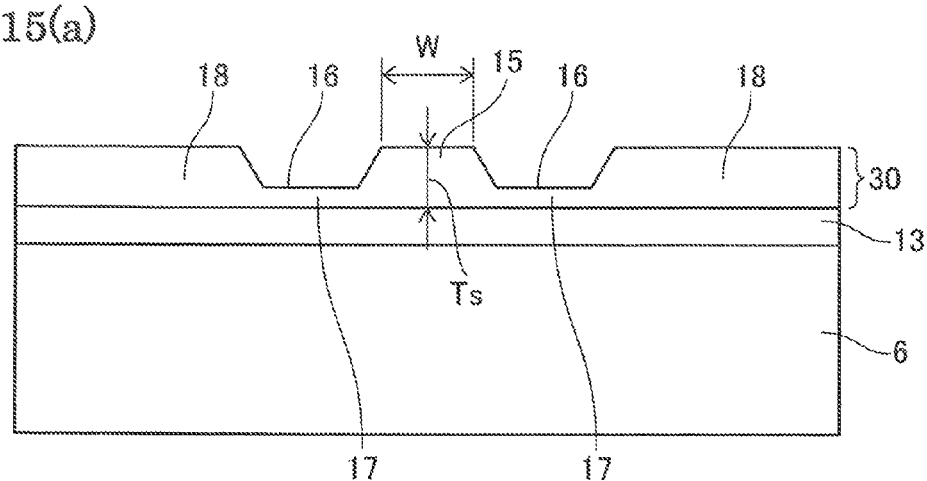
FIGS. 15(a), 15(b) and 15(c) each are a view schematically showing a cross section of a grating element including a ridge type optical waveguide.

According to a preferred embodiment, as shown in FIG. 15(a), the optical material layer 30 is formed on a substrate 6 via a lower side buffer layer 13. For example, a pair of ridge grooves 16 is formed in the optical material layer 30, and a ridge type optical waveguide 15 is formed between the ridge grooves. In this case, the Bragg grating may be formed on a flat surface, or may be formed on a ridge groove surface. From the viewpoint of reducing the variation in shapes of the Bragg grating and ridge groove, it is preferable to provide the Bragg grating and the ridge groove on the opposite sides of the optical material layer 30 by forming the Bragg grating on the flat surface. Numeral 17 represents a thin part, and Numeral 18 represents an extension part. In addition, an adhesive layer may be also provided between the buffer layer 13 and the supporting substrate 6.

As shown in FIG. 15(a), in cases where no upper side buffer layer is provided, an air layer thereof can come in direct contact with the grating. Thus, the diffractive index difference can be increased via the presence and absence of the grating groove, and reflectance can be increased with a short grating length.

Figure 15B:
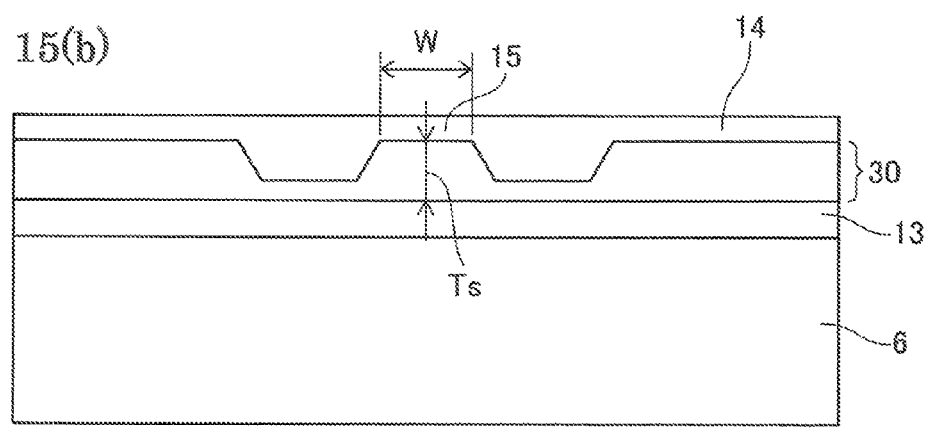

Further, in the case of the element shown in FIG. 15(b), an upper side buffer layer 14 is further formed on the optical material layer 30.

Figure 15C:
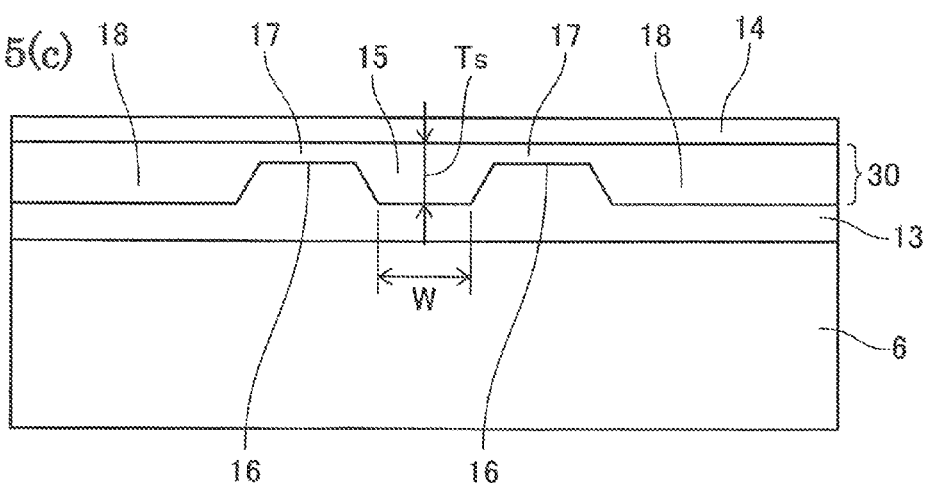

Further, as shown in FIG. 15(c), the optical material layer 30 is formed on the substrate 6 via the lower side buffer layer 13. For example, a pair of ridge grooves 16 is formed in the optical material layer 30, and a ridge type optical waveguide 15 is formed between the ridge grooves. In the present example, the ridge groove is provided on the buffer layer 13 side. In this case, the Bragg grating may be formed on a flat surface, or may be formed on a ridge groove surface. From the viewpoint of reducing the variation in shapes of the Bragg grating and ridge groove, it is preferable to provide the Bragg grating and the ridge groove on the opposite sides of the substrate by forming the Bragg grating on the flat surface. Numeral 17 represents a thin part, and Numeral 18 represents an extension part. In addition, an adhesive layer may be also provided between the buffer layer 13 and the supporting substrate 6.

According to a preferred embodiment, the optical waveguide is composed of a core made of an optical material, and a clad surrounds the circumference of the core. The cross section (the cross section in the direction perpendicular to the propagation direction of light) shape of this core is arranged to be a convex figure.

The convex figure means that line segments connecting two arbitrary points on an outside contour line of the cross section of a core are positioned inside the outside contour line of the cross section of the core. The convex figure is a general term in geometry. Examples which can be exemplified as such a figure include polygon such as triangle, tetragon, hexagon, octagon or the like, circle, ellipse, and so forth. Specifically, the tetragon possessing an upper side, a lower side, and a pair of side faces is preferable as a tetragon, and a trapezoid is specifically preferable.

Figure 16A:
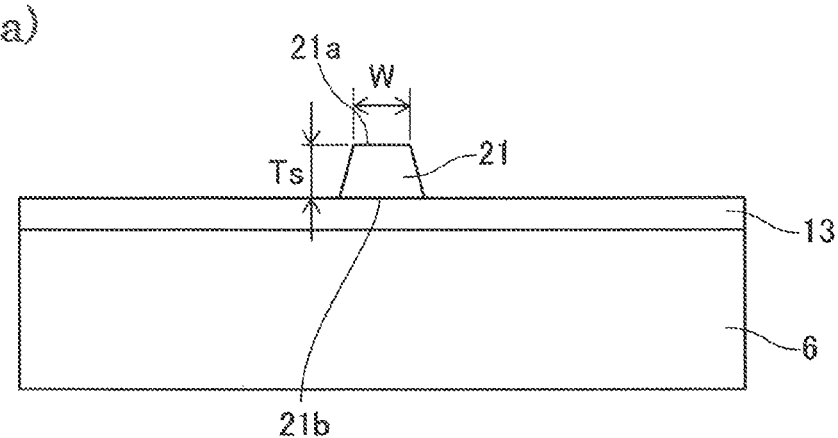
FIGS. 16(a), 16(b) and 16(c) each are a view schematically showing a cross section of a grating element including an optical waveguide whose cross section is a trapezoid.

For example, as shown in FIG. 16(a), an optical waveguide 21 includes a core made of an optical material is formed on a substrate 6 via the lower side buffer layer 13. The lower side buffer layer 13 that functions as a clad is present on the lower side of this optical waveguide 21. No upper side buffer layer is provided on the side face and the upper surface of the optical waveguide 21. For this reason, the side face and the upper surface of the optical waveguide 21 are exposed to the atmosphere, and thus the atmosphere functions as a clad. The cross sectional shape of the optical wavelength 21 is a trapezoid, and an upper face 21a is narrower than a lower face 21b. In addition, an adhesive layer can be also formed between the buffer layer 13 and the supporting substrate 6.

Figure 16B:
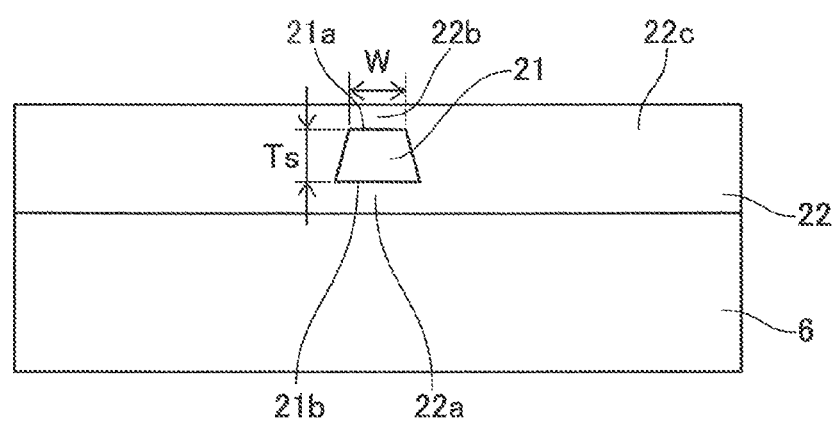

According to an element shown in FIG. 16(b), a buffer layer 22 is formed on the substrate 6, and the optical waveguide 21 includes a core made of an optical material is embedded inside the buffer layer 22. The buffer layer 22 includes an upper face covering part 22b covering the upper face of the optical waveguide, a side face covering part 22c covering the side faces of the optical waveguide, and a bottom face covering part 22a covering the bottom face of the optical waveguide.

Figure 16C:
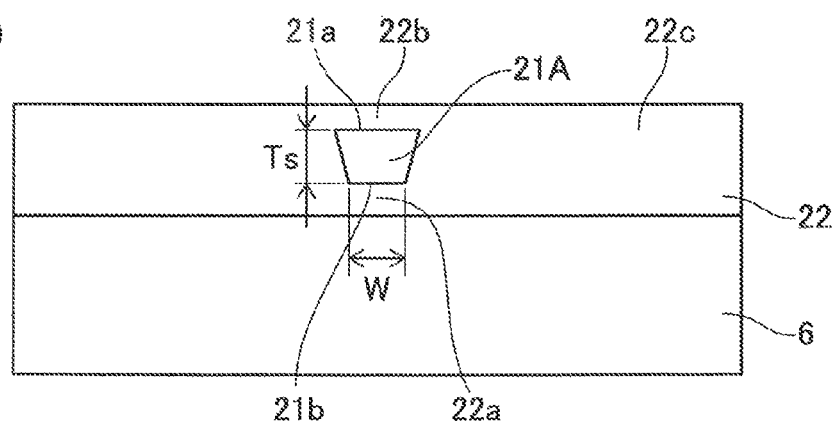

According to an element 9D shown in FIG. 16(c), a buffer layer 22 is formed on the substrate 6, and an optical waveguide 21A includes a core made of an optical material is embedded inside the buffer layer 22. The buffer layer 22 includes an upper face covering part 22b covering the upper face of the optical waveguide, a side face covering part 22c covering the side faces of the optical waveguide, and a bottom face covering part 22a covering the bottom face of the optical waveguide.

Figure 17A:
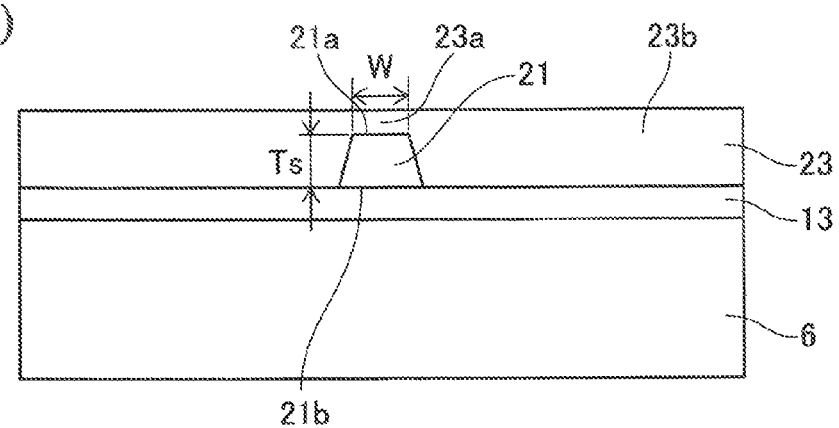
FIGS. 17(a) and 17(b) each are a view schematically showing a cross section of a grating element including an optical waveguide whose cross section is a trapezoid.

Further, according to an element shown in FIG. 17(a), an optical waveguide 21 composed of a core made of an optical material is formed on a substrate 6 via a lower side buffer layer 13. An upper side buffer layer 23 also functions as a clad is formed on side faces and an upper face 21a of the optical waveguide 21 to cover the optical waveguide 21. An upper side buffer layer 23 includes a side face covering part 23b covering the side faces of the optical waveguide 21 and an upper face covering part 23a covering the upper face of the optical waveguide.

Figure 17B:
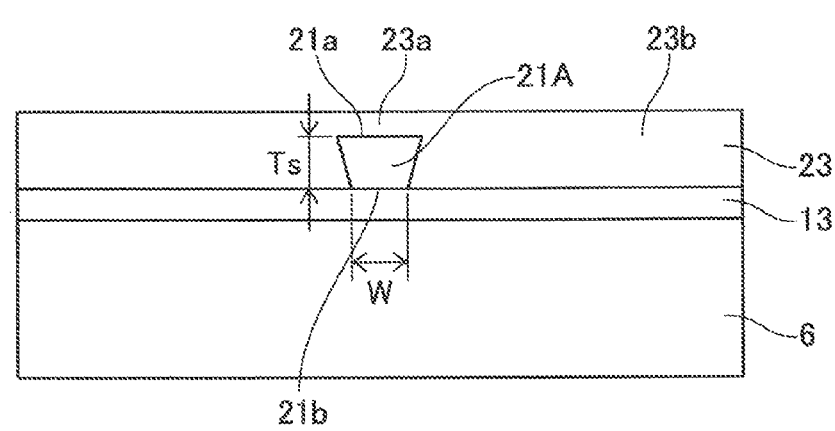

Further, according to an element shown in FIG. 17(b), an optical waveguide 21A composed of a core made of an optical material is formed. The cross sectional shape of the optical waveguide 21A is a trapezoid, and the lower face is narrower than the upper face. An upper side clad layer 23 includes a side face covering part 23b covering the side faces of the optical waveguide 21A and an upper face covering part 23a covering the upper face of the optical waveguide.

In addition, a width W of the optical waveguide means a minimum value of the width of the optical waveguide on a cross section thereof. In cases where the optical waveguide has a trapezoid in shape, whose upper face is narrow, the width W of the optical waveguide is a width of the upper face, and in cases where the optical waveguide has a trapezoid in shape, whose lower face is narrow, the width W of the optical waveguide is a width of the lower face. In addition, symbol W means an inclusive concept of Win, Wout and Wgr.

According to a preferred embodiment, as shown in FIGS. 1 and 2, an incident side propagation portion is provided between the incident face 7a of the optical waveguide 7 and the start point of Bragg gratings, and further, an emitting side propagation portion is provided between the end point of the Bragg gratings and the emitting face.

According to a preferred embodiment, as shown in for example, FIGS. 18(a) and 18(b), the incident side propagation portion 8 includes an incident portion 8a continuous from the incident face, a narrow width portion 8c leading to the Bragg gratings, and a tapered portion 8b gradually changing in optical waveguide width. The width Win of the incident portion 8a is set to be larger than the width Wgr of the narrow width portion 8c.

Further, the optical waveguide width Wout in the emitting side propagation portion has become identical to Wgr according to the example shown in FIG. 18(a). However, Wout may be larger than Wgr, and may be smaller than Wgr. According to the example shown in FIG. 18(b), the emitting side propagation portion 9 includes a connection portion 9a continuous from the Bragg gratings, and a tapered portion 9c directed toward an emitting end portion. The optical waveguide width in the tapered portion 9c becomes gradually reduced toward the optical waveguide width Wout at the emitting end portion.

Figure 19:
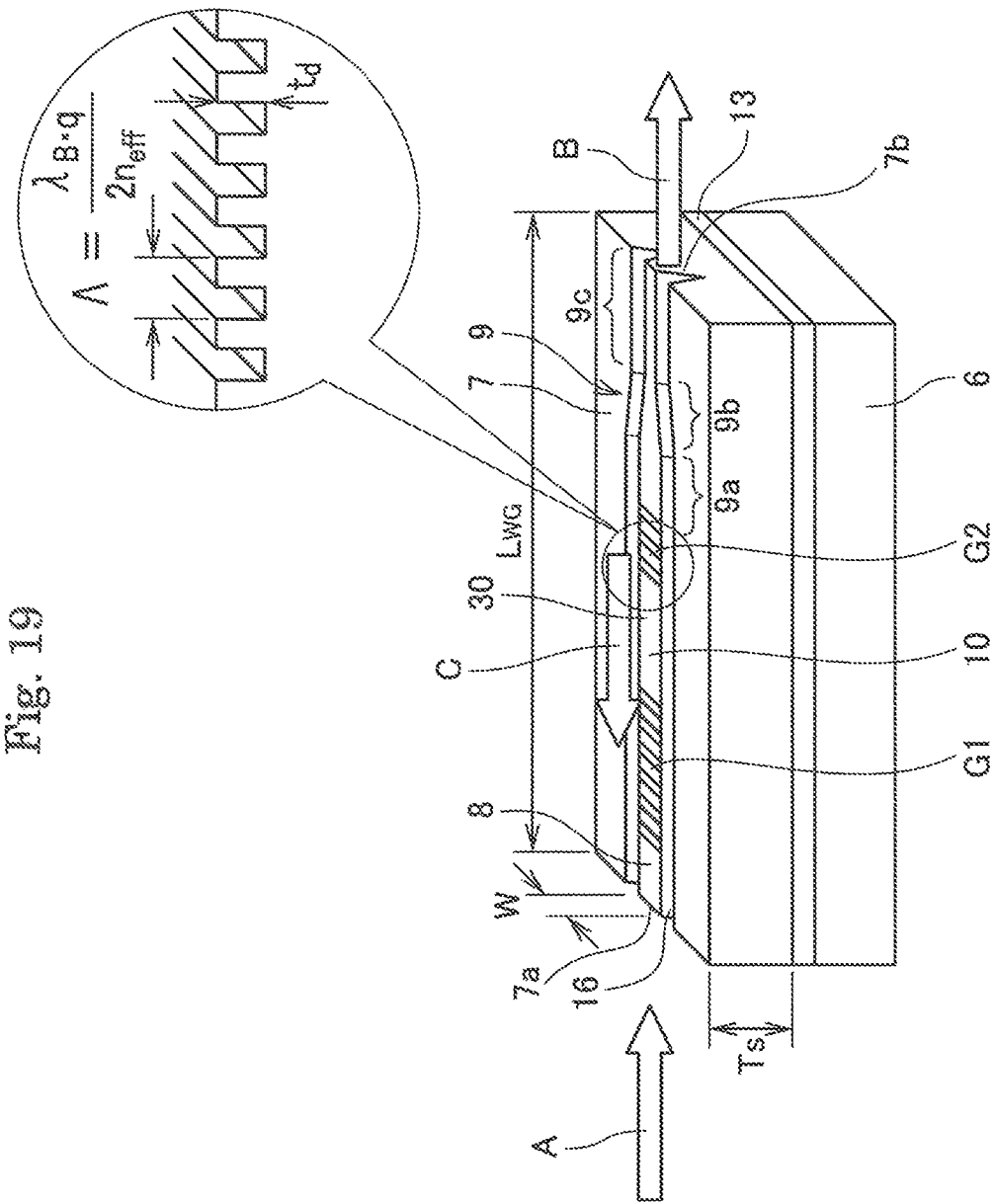
FIG. 19 is a perspective view schematically showing a grating element.

According to an example shown in the perspective view of FIG. 19, the emitting side propagation portion 9 includes a connection portion 9a continuous from the Bragg gratings, an emitting portion 9c connected to the emitting end portion, and a tapered portion 9b provided between the connection portion 9a and the emitting portion 9c. The optical waveguide width in the tapered portion 9b becomes gradually reduced toward the optical waveguide width Wout at the emitting end portion.

In addition, according to the present example, the optical waveguide width Wgr in the connection portion 9a is constant, and the optical waveguide width Wout in the emitting portion 9c is also constant.

In addition, symbol A represents light incident on the grating element; symbol B represents light emitting from the grating element; and symbol C represents grating reflection light.

In order to suppress mode hopping and to secure temperature stability of the device, there is a need for the mode hopping to have an increased interval by shortening the resonator length. From this viewpoint, a distance L (refer to FIGS. 1, 2 and 6) from an outside reflection end of a semiconductor laser to an emitting side end point of a plurality of Bragg gratings is preferably 1 mm or less, and further, from the viewpoint of increasing the longitudinal mode interval of an external resonator to suppress mode hopping, L is preferably 700 μm or less, and most preferably 500 μm or less.

In order to satisfy the above-described relationship, a length $L_{btotal}$ from a start point to an end point of the Bragg grating is preferably 500 μm or less, more preferably 300 μm or less, and most preferably 100 μm or less. Further, in order to obtain a feedback rate of light necessary for laser oscillation, $L_{btotal}$ is preferably 10 μm or more, and more preferably 20 μm or more.

From the viewpoint of shortening the resonator length, the lengths of Bragg gratings are preferably 200 μm or less, respectively. Further, the longer the grating length is, the smaller the $\Delta\lambda_{Gn}$ becomes, and thus in order to increase this, the length of each Bragg grating is preferably 100 μm or less. Further, in order to obtain a feedback rate of light necessary for laser oscillation, $\Delta\lambda_{Gn}$ is preferably 10 μm or more.

In order to shorten the length of a grating element, and to make the reflectance to be larger than reflectance at the emitting end of the semiconductor laser, it is preferable to increase a difference between a refractive index nb of an optical waveguide forming gratings, and the refractive index nc of a clad part. Thus, nb is preferably 1.7 or more, and more preferably 1.8 or more.

Further, in order to make the grating reflectance to be larger than that at the emitting end face of a semiconductor laser, the grating depth td (refer to FIG. 9) is preferably 20 nm or more. Further, the grating depth td is preferably 250 nm or less, and more preferably 200 nm or less.

From the viewpoint of improving the coupling efficiency of a semiconductor laser, an optical waveguide preferably has a height (thickness) Ts (refer to FIGS. 16-17) of 0.5 μm or more and 3.0 μm or less.

From the viewpoint of a single mode waveguide, an optical waveguide of Bragg gratings preferably has a width Wgr (refer to FIG. 8) of 0.5 μm or more and 4 μm or less.

According to a preferred embodiment, a distance Lg (refer to FIGS. 1, 2 and 6) between the emitting face of the light source and the incident face of the optical waveguide may be 0, but is set to be 1 μm or more and 10 μm or less from the viewpoint of relaxing a stress caused by thermal expansion depending on temperature change of each element. The stable oscillation becomes possible with this. Further, the length Lm of the incident side propagation portion may be 0, but is preferably 1-100 μm, and more preferably 5-20 μm.

The active layer in the light source preferably has a length La of 500 μm or less.

Further, La+Lg+Lm+$L_{btotal}$ is preferably 1050 μm or less, and more preferably 800 μm or less. Further, La+Lg+Lm+$L_{btotal}$ is preferably 300 μm or more.

A laser obtained from a GaAs material system or an InP material system exhibiting high reliability is preferable as a light source. As a structure application case according to the present application, for example, in the case of executing the second harmonic green laser oscillation by using a nonlinear optical element, a GaAs system laser oscillating at a wavelength of approximately 1064 nm is to be used. A GaAs system laser and an InP system laser each exhibits high reliability, and thus light sources such as a laser array arranged in the one-dimensional state and so forth are also possible to be realized. A superluminescent diode and a semiconductor optical amplifier (SOA) may be also accepted. Further, the material and wavelength of an active layer can be appropriately selected.

In addition, a method for stabilizing power by using a semiconductor laser and a grating element in combination has been disclosed as described below.
(Non-patent document 1: Furukawa Review No. 105, pp. 24-29, January 2000)

An optical waveguide is obtained by physically performing a processing via for example, cutting processing with a peripheral cutting edge, or laser ablation processing, followed by molding.

The Bragg gratings may be formed by carrying out physical or chemical etching as described below.

As a specific example, a metal film such as Ni, Ti or the like is film-formed a high refractive index substrate, and windows are periodically formed by photolithography to form a mask for etching. Periodical grating grooves are subsequently formed by a dry etching apparatus for reactive ion etching and so forth. Lastly, the metal mask is removed therefrom to form them.

In order to further improve an optical damage-resistance property of an optical waveguide, at least one metal element selected from the group consisting of magnesium (Mg), zinc (Zn), scandium (Sc) and indium (In) may be contained in the optical waveguide, and in this case, magnesium is specifically preferable. Further, a rare earth element may be contained in a crystal as a doping component. Specifically preferable examples of the rare earth include Nd, Er, Tm, Ho, Dy and Pr.

The material for an adhesive layer may be an inorganic adhesive; may be an organic adhesive; or may be one prepared by using the inorganic adhesive and the organic adhesive in combination.

Further, an optical material layer 30 may be film-formed on a supporting substrate by a film-forming method to form the optical material layer. Examples of such a film-forming method which can be exemplified include sputtering, vapor evaporation and CVD. In this case, the optical material layer 30 is formed directly on the supporting substrate, and thus no adhesive layer described above is present.

The specific material of the supporting substrate is not particularly limited thereto, and examples thereof include lithium niobate, lithium tantalate, glass and quartz such as quartz glass and so forth, Si, and so forth.

The reflectance of an antireflection layer should be not more than the grating reflectance, and a film laminated with an oxide such as silicon dioxide, tantalum pentoxide, magnesium fluoride, calcium fluoride or the like, and metals are usable as a film material to be formed on the antireflection film.

Further, each end face of the light source element and grating element may be cut at a slant to suppress the reflection at each end face. Further, joining the grating element to the supporting substrate may be adhesion fixing, or may be direct bonding.

Figure 20:
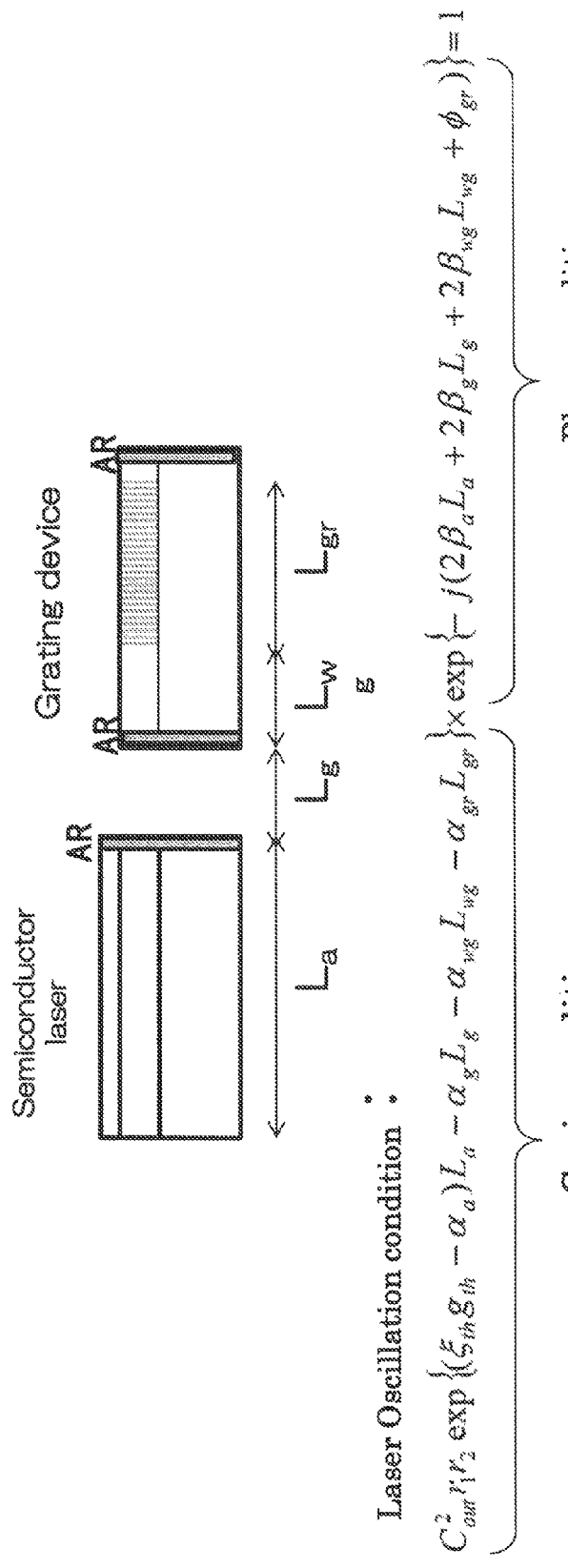
FIG. 20 is a diagram for illustrating a laser oscillation condition.

Next, as to the configuration as shown in FIG. 20, the meaning of the condition of the present embodiment will be further described.

However, since the mathematical formulae are abstract and difficult to be understood, atypical embodiment of conventional technology and the present embodiment will be directly compared with each other to firstly describe the features of the present embodiment. About individual conditions for this embodiment, a description will next be made one by one.

First, the oscillation condition of a semiconductor laser is determined by multiplying the gain condition by the phase condition as shown in the following formula.

$$(C_{out}^2)^4 |r_1||r_2| \exp\{(\zeta_t g_{th} - \alpha_a) L_a - \alpha_b L_b\} \times \exp\{j(-\varphi_1 - \varphi_2 - 2\beta L_a)\} = 1 \quad \text{Formula(2-1)}$$

The gain condition is expressed as the following formula from the formula (2-1).

$$\zeta_t g_{th} = \alpha_a L_a + \alpha_b L_b + \frac{1}{L_a} \ln\left(\frac{1}{|r_1||r_2|C_{out}^2}\right) \quad \text{Formula (2-2)}$$

Herein, αa, αg, αwg and αgr represent loss coefficients of an active layer, a gap between a semiconductor laser and a waveguide, a grating-unprocessed waveguide portion on the input side, and a grating portion, respectively; La, Lg, Lwg and Lgr represent lengths of the active layer, the gap between the semiconductor laser and the waveguide, the grating-unprocessed waveguide portion on the input side, and the grating portion, respectively; r1 and r2 each represent mirror reflectances (r2 represents grating reflectance); Cout represents coupling loss between a grating element and a light source; $\zeta_t g_{th}$ represents a gain threshold value of a laser medium; φ1 represents a phase change amount produced by a reflection mirror on the laser side; and φ2 represents a phase change amount at the grating portion.

The formula (2-2) indicates occurrence of laser oscillation in cases where the gain $\zeta_t g_{th}$ (gain threshold value) of the laser medium exceeds the loss. The gain curve (wavelength dependent) of the laser medium has a full width at half maximum of 50 nm or more, and exhibits broad characteristics. Further, the loss portion (right side) hardly depends on wavelength except the grating reflectance, and thus the gain condition is determined by the grating. For this reason, according to the comparison table, the gain condition can be taken into consideration only by the grating.

On the other hand, the phase condition is expressed as the following formula from the formula (2-1). However, φ1 becomes zero.

$$\varphi_2 + 2\beta_a L_a + 2\beta_g L_g + 2\beta_{wg} L_{wg} = 2p\pi \text{ (p represents an integer)} \quad \text{Formula (2-3)}$$

The length $L_{btotal}$ of the Bragg grating has been given as described previously. It is based on the premise of design concept according to the present embodiment that the length $L_{btotal}$ of the Bragg grating is set to be shorter than conventional one. That is to say, in order to make it difficult to occur mode hopping, the wavelength interval (longitudinal mode interval) meeting the phase condition should be set to be larger. For this reason, the resonator length should be shortened, and the grating element length is shortened.

To shorten the grating element length means to reduce the loss, and thus the laser oscillation threshold value can be reduced. From this result, operations are possible at low electric current, low heat generation and low energy.

Further, the grating length $L_{btotal}$ is preferably 5 μm or more in order to obtain a reflectance of 3% or more, and is more preferably 10 μm or more in order to obtain a reflectance of 5% or more.

EXAMPLES

Example 1

The external resonator type laser module was prepared as shown in FIG. 6. The light-emitting device as shown in FIGS. 4 and 15(b) was produced.

Specifically, a 1 μm thick $SiO_2$ layer as a lower side buffer layer 13 was formed on a supporting substrate 6 formed from quartz by a sputtering apparatus, and a 1.2 μm thick $Ta_2O_5$ film was formed thereon to form an optical material layer 30. Next, Ti was film-formed on the optical material layer to prepare grating patterns with an EB lithography apparatus. Then, Ti patterns were used as a mask, and three Bragg gratings G1, G2 and G3 were formed by fluorine-based reactive ion etching. The length of the intermediate propagating portion 10 was 0 μm. The grating groove was set to have a depth td of 200 nm.

G1: Pitch interval Λ 190 nm, length Lb 8 μm
G2: Pitch interval Λ 192.5 nm, length Lb 8 μm
G3: Pitch interval Λ 195 nm, length Lb 8 μm Further, in order to form an optical waveguide, reactive ion etching was carried out by the same method as described above to form a ridge shape of a width W of 3 μm and a groove depth of 1 μm. A 0.5 μm thick $SiO_2$ layer as an upper side buffer layer 14 was lastly formed by sputtering.

Thereafter, the resulting was cut in the form of bars by a dicing apparatus; both end faces thereof were subjected to optical polishing; AR coat of 0.1% was formed on each of the both end faces; and chip cutting was lastly carried out to produce the grating element. The element size was set to a width of 1 mm and a length Lwg of 500 μm.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics.

The reflection central wavelength of measured grating element was 791 nm, and its maximum reflectance was 36% Further, the full width at half maximum $\Delta\Lambda_{50}$ was 21 nm and $\Delta\Lambda_{70}$ was 20 nm.

Next, in order to evaluate characteristics of the external resonator type laser in which this grating element was used, the laser module was mounted as shown in FIG. 6. As a light source element, a GaAs system laser structure was included; high reflection film was provided on one end face; and the reflectance at the other emitting end face was 8%.

Light source element specification:
 Central wavelength: 790 nm
 Output power 20 mW
 full width at half maximum: 0.1 nm
 Laser element length: 300 μm
Mounting specification:
 Lg: 0.5 μm
 Lm: 10 μm When being driven under the current control (ACC) without using a Peltier element after mounting the module, laser oscillation occurred at a central wavelength of 791 nm at a temperature of 25° C., and an output power of 13 mW was obtained. Next, in order to evaluate the operation temperature range, the module was set in a thermostatic bath to measure the temperature dependency of the laser oscillation wavelength, and the fluctuation of output power thereof. As a result, on the high temperature side, the osculation wavelength proved to be 800 nm at a temperature of 70° C., and the fluctuation of power was within 0.5 percent in this temperature range. Further, on the low temperature side, the oscillation wavelength proved to be 787 nm and the fluctuation of power was within 0.5 percent in this temperature range. However, under the temperature, the measurement could not be carried out because of condensation.

Comparative Example 1

The light-emitting device similar to that of the example 1 was produced. However, in the grating device, it was formed a single grating G1 having a pitch interval Λ of 192.5 nm and a length Lb of 25 m (refer to FIG. 3). The grating groove was set to have a depth td of 125 nm.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics.

The reflection central wavelength of measured grating element was 791 nm, its maximum reflectance was 18%, the full width at half maximum $\Delta\Lambda_{50}$ was 5 nm and $\Delta\Lambda_{70}$ was 4 nm.

Next, in order to evaluate characteristics of the external resonator type laser in which this grating element was used, the laser module was mounted as shown in FIGS. 6 and 19. As a light source element, a GaAs system laser structure was included; high reflection film was provided on one end face; and the reflectance at the other emitting end face was 8%.
Light source element specification:
  Central wavelength: 790 nm
  Output power 20 mW
  full width at half maximum: 0.1 nm
  Laser element length: 300 μm
Mounting specification:
  Lg: 0.5 μm
  Lm: 10 μm When being driven under the current control (ACC) without using a Peltier element after mounting the module, laser oscillation occurred at a central wavelength of 791 nm at a temperature of 25° C., and an output power of 15 mW was obtained. Next, in order to evaluate the operation temperature range, the module was set in a thermostatic bath to measure the temperature dependency of the laser oscillation wavelength, and the fluctuation of output power thereof. As a result, on the high temperature side, the oscillation wavelength proved to be 795 nm at a temperature of 45° C., and the fluctuation of power was within 1 percent in this temperature range. However, when the temperature exceeds 45° C., the fluctuation of the power occurred with a variation of output power of 3 percent. On the low temperature side, the oscillation wavelength proved to be 789 nm at a temperature of 15° C., and the fluctuation of power was within 1 percent in this temperature range. However, when the temperature is below 15° C., the fluctuation of the power occurred with a variation of output power of 3 percent.

Example 2

The light-emitting device similar to that of the example 1 was produced.

However, in the grating device, it was formed the following gratings G1 and G2 (refer to FIG. 5). The grating groove was set to have a depth td of 200 nm.
G1=Pitch interval Λ 191 nm, length Lb 6 μm
G2=Pitch interval Λ 193 nm, length Lb 6 μm As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics.

The reflection central wavelength of measured grating element was 791 nm, its maximum reflectance was 30%.

Next, in order to evaluate characteristics of the external resonator type laser in which this grating element was used, the laser module was mounted as shown in FIGS. 6 and 19. As a light source element, a GaAs system laser structure was included; high reflection film was provided on one end face; and the reflectance at the other emitting end face was 8%.
Light source element specification:
  Central wavelength: 790 nm
  Output power 20 mW
  full width at half maximum: 0.1 nm
  Laser element length: 300 μm
Mounting specification:
  Lg: 0.5 μm
  Lm: 10 μm When being driven under the current control (ACC) without using a Peltier element after mounting the module, laser oscillation occurred at a central wavelength of 791 nm at a temperature of 25° C., and an output power of 15 mW was obtained. Next, in order to evaluate the operation temperature range, the module was set in a thermostatic bath to measure the temperature dependency of the laser oscillation wavelength, and the fluctuation of output power thereof.

As a result, on the high temperature side, the oscillation wavelength proved to be 796 nm at a temperature of 50° C. and 797.5 nm at a temperature of 58° C., and the fluctuation of power was within 0.5 percent in this temperature range under 50° C. However, when the temperature exceeds 58° C., the fluctuation of the power occurred with a variation of output power of 3 percent. Further, on the low temperature side, the oscillation wavelength proved to be 785 nm at a temperature of 5° C., and the fluctuation of power was within 0.5 percent in this temperature range. However, when the temperature is below 5° C., the measurement was not carried out because of condensation.

Comparative Example 2

The light-emitting device similar to that of the example 2 was produced. In the grating device, it was formed gratings G1 and G2 having a pitch interval Λ of 191 nm and a length Lb of 6 μm and a pitch interval Λ of 193 nm and a length Lb of 6 μm, respectively. A distance between the gratings G1 and G2 was made 96 nm.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics.

The reflection central wavelength of measured grating element exhibits two peaks at wavelengths of 780 nm and 800 nm with the reflectances of 18 percent, respectively. Further, the full width at half maximum $\Delta\Lambda_{50}$ was 9 nm and $\Delta\Lambda_{70}$ was 8 nm.

Next, in order to evaluate characteristics of the external resonator type laser in which this grating element was used, the laser module was mounted as shown in FIGS. 6 and 19.

As a light source element, a GaAs system laser structure was included; high reflection film was provided on one end face; and the reflectance at the other emitting end face was 8%.
Light source element specification:
　Central wavelength: 790 nm
　Output power 20 mW
　full width at half maximum: 0.1 nm
　Laser element length: 300 μm
Mounting specification:
　Lg: 0.5 μm
　Lm: 10 μm When being driven under the current control (ACC) without using a Peltier element after mounting the module, laser oscillation occurred at a central wavelength of 780 nm at a temperature of 25° C., and an output power of 17 mW was obtained. Next, in order to evaluate the operation temperature range, the module was set in a thermostatic bath to measure the temperature dependency of the laser oscillation wavelength, and the fluctuation of output power thereof.

As a result, on the high temperature side, the oscillation wavelength proved to be 784 nm at a temperature of 45° C., 786 nm at a temperature of 55° C., and the fluctuation of power was within 0.5 percent in this temperature range under 45° C. Further, the fluctuation of power was within 1 percent up to 55° C., and when the temperature exceeds 55° C., the fluctuation of the power occurred with a variation of output power of 3 percent. Further, on the low temperature side, the oscillation wavelength proved to be 776 nm at a temperature of 5° C., and the fluctuation of power was within 0.5 percent in this temperature range. However, when the temperature is below 5° C., the measurement could not be carried out because of condensation.

The invention claimed is:

1. An external resonator type light-emitting device comprising a light source oscillating a semiconductor laser light and a grating element configuring an external resonator together with said light source:
　wherein said light source comprises an active layer oscillating said semiconductor laser light;
　wherein said grating element comprises an optical waveguide and a plurality of Bragg gratings formed in said optical waveguide, said optical waveguide comprising an incident face to which said semiconductor laser light is incident and an emitting face from which an emitting light having a desired wavelength is emitted, and said Bragg gratings having periods different from each other;
　wherein said Bragg gratings comprise a combined reflectance;
　wherein said combined reflectance comprises a maximum value Rmax;
　wherein said combined reflectance further comprises a half value reflectance $R_{50}$ which is defined as 50 percent of said maximum value Rmax of said combined reflectance;
　wherein said light source comprises a reflectance $R_2$ at an emitting end of said light source;
　wherein said half value reflectance $R_{50}$ is larger than said reflectance $R_2$ at said emitting end of said light source;
　wherein said half value reflectance $R_{50}$ is 3% or larger;
　wherein said combined reflectance of said Bragg gratings is not less than said half value reflectance $R_{50}$ in a wavelength region $\Delta\lambda_{50}$, and
　wherein said wavelength region $\Delta\lambda_{50}$ is continuous over 10 nm or more and 30 nm or less.

2. The device of claim 1, wherein said combined reflectance is not less than 70% of said maximum value Rmax of said combined reflectance in a wavelength region $\Delta\lambda_{70}$, said wavelength region $\Delta\lambda_{70}$ being continuous over 10 nm or more and 25 nm or less.

3. The device of claim 1, wherein said light source is capable of oscillating said semiconductor laser light alone by itself.

4. The device of claim 1,
　wherein a distance between a reflection end opposite to said emitting end of said light source and an emitting side end point of said Bragg gratings is 1 mm or less, and
　wherein the following formulae (1) and (2) are satisfied:

$$L_{btotal} \leq 300 \text{ μm} \tag{1}$$

$$La \leq 500 \text{ μm} \tag{2}$$

where $L_{btotal}$ represents a length from a start point to an emitting side end point of said Bragg gratings in the formula (1), and
　La represents a length of said active layer in the formula (2).

5. The device of claim 1, wherein said Bragg gratings adjacent to each other are continuously formed.

6. The device of claim 1, wherein the following formula (3) is satisfied:

$$\Delta\lambda_{50} \leq 0.7 \times \Sigma(\Delta\lambda_{G(n)}) \tag{3}$$

where $\Sigma(\Delta\lambda_{G(n)})$ represents a sum of full widths at half maximum $\lambda_{G(n)}$ at which each of said reflectances of said Bragg gratings is 50% of each of maximum values of said reflectances, in the formula (3).

7. The device of claim 1, wherein a material forming said Bragg gratings has a refractive index nb of 1.7 or more.

8. The device of claim 1, wherein said optical waveguide includes an incident side propagating portion provided between a start point of said Bragg gratings and said incident face; and
　wherein said incident side propagating portion includes a tapered portion in which a width of said optical waveguide varies.

* * * * *